(12) United States Patent
Kashiwabara et al.

(10) Patent No.: US 10,916,593 B2
(45) Date of Patent: *Feb. 9, 2021

(54) DISPLAY UNIT

(71) Applicant: Sony Corporation, Tokyo (JP)

(72) Inventors: Mitsuhiro Kashiwabara, Kanagawa (JP); Jiro Yamada, Kanagawa (JP); Seiichi Yokoyama, Kanagawa (JP); Kohji Hanawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/502,948

(22) Filed: Jul. 3, 2019

(65) Prior Publication Data

US 2019/0326358 A1 Oct. 24, 2019

Related U.S. Application Data

(60) Continuation of application No. 15/912,527, filed on Mar. 5, 2018, now Pat. No. 10,347,697, which is a (Continued)

(30) Foreign Application Priority Data

Sep. 19, 2003 (JP) ................................. 2003-327497
Sep. 19, 2003 (JP) ................................. 2003-328989
Sep. 8, 2004 (JP) ................................. 2004-261506

(51) Int. Cl.
*H01L 51/00* (2006.01)
*H01L 27/32* (2006.01)
(Continued)

(52) U.S. Cl.
CPC .......... *H01L 27/322* (2013.01); *H01L 27/153* (2013.01); *H01L 27/3206* (2013.01);
(Continued)

(58) Field of Classification Search
CPC ............. H01L 27/3311; H01L 51/5203; H01L 27/3211; H01L 27/3206; H01L 27/153
See application file for complete search history.

(56) References Cited

U.S. PATENT DOCUMENTS 5,405,710 A    4/1995    Dodabalapur et al.
5,847,506 A    12/1998    Nakayama et al.
(Continued)

FOREIGN PATENT DOCUMENTS

EP    0616488    9/1994
EP    0653902    5/1995
(Continued)

OTHER PUBLICATIONS

Extended European Search Report dated Dec. 18, 2015 in corresponding European Application No. 15182366.3.
(Continued)

*Primary Examiner* — Samuel A Gebremariam
(74) *Attorney, Agent, or Firm* — K&L Gates LLP

(57) ABSTRACT

A display unit includes a plurality of light emitting devices, each of the light emitting devices including a function layer including at least an organic layer is sandwiched between a first electrode and a second electrode, and which have a resonator structure for resonating light by using a space between the first electrode and the second electrode as a resonant section and extracting the light through the second electrode are arranged on a substrate, wherein in the respective light emitting devices, the organic layer is made of an identical layer, and a distance of the resonant section between the first electrode and the second electrode is set to a plurality of different values.

19 Claims, 25 Drawing Sheets

Related U.S. Application Data continuation of application No. 15/432,395, filed on Feb. 14, 2017, now Pat. No. 9,911,792, which is a continuation of application No. 15/177,577, filed on Jun. 9, 2016, now Pat. No. 9,627,453, which is a continuation of application No. 14/749,282, filed on Jun. 24, 2015, now Pat. No. 9,373,672, which is a continuation of application No. 14/339,987, filed on Jul. 24, 2014, now Pat. No. 9,123,666, which is a continuation of application No. 13/786,808, filed on Mar. 6, 2013, now abandoned, which is a continuation of application No. 13/160,205, filed on Jun. 14, 2011, now Pat. No. 8,415,686, which is a division of application No. 10/571,845, filed as application No. PCT/JP2004/013647 on Sep. 17, 2004, now Pat. No. 7,973,319.

(51) Int. Cl.
*H01L 51/52* (2006.01)
*H01L 27/15* (2006.01)

(52) U.S. Cl.
CPC ...... *H01L 27/3211* (2013.01); *H01L 27/3258* (2013.01); *H01L 27/3276* (2013.01); *H01L 27/3279* (2013.01); *H01L 51/5203* (2013.01); *H01L 51/524* (2013.01); *H01L 51/5206* (2013.01); *H01L 51/5209* (2013.01); *H01L 51/5218* (2013.01); *H01L 51/5221* (2013.01); *H01L 51/5228* (2013.01); *H01L 51/5234* (2013.01); *H01L 51/5265* (2013.01); *H01L 51/5271* (2013.01); *H01L 2251/5315* (2013.01); *H01L 2251/558* (2013.01)

(56) References Cited

U.S. PATENT DOCUMENTS

| | | | |
|---|---|---|---|
| 6,541,130 | B2 | 4/2003 | Fukuda |
| 6,861,800 | B2 | 3/2005 | Tyan et al. |
| 7,019,331 | B2 | 3/2006 | Winters et al. |
| 7,250,634 | B2 | 7/2007 | Yokoyama |
| 7,615,792 | B2 | 11/2009 | Yokoyama |
| 7,973,319 | B2 | 7/2011 | Kashiwabara et al. |
| 8,415,686 | B2 | 4/2013 | Kashiwabara |
| 9,123,666 | B2 | 9/2015 | Kashiwabara |
| 9,373,672 | B2 | 6/2016 | Kashiwabara |
| 9,726,453 | B1 | 4/2017 | Kashiwabara |
| 9,911,792 | B2 * | 3/2018 | Kashiwabara ...... H01L 27/3211 |
| 2001/0015256 | A1 | 8/2001 | Yamazaki et al. |
| 2001/0050532 | A1 * | 12/2001 | Eida ...................... H05B 33/10 |
| | | | 313/504 |
| 2003/0017389 | A1 | 1/2003 | Kasahara et al. |
| 2003/0044639 | A1 | 3/2003 | Fukuda |
| 2003/0107314 | A1 | 6/2003 | Urabe et al. |
| 2003/0202673 | A1 | 10/2003 | Tajima et al. |
| 2013/0207138 | A1 | 8/2013 | Mitsuhiro et al. |

FOREIGN PATENT DOCUMENTS

| | | |
|---|---|---|
| EP | 1154676 | 11/2001 |
| EP | 1331666 | 7/2003 |
| JP | 10-003990 | 1/1998 |
| JP | 10-289784 | 10/1998 |
| JP | 11-282383 | 10/1999 |
| JP | 2000-323277 | 11/2000 |
| JP | 2002-244073 | 8/2002 |
| JP | 2002-299057 | 10/2002 |
| JP | 2002-299066 | 10/2002 |
| JP | 2002-532830 | 10/2002 |
| JP | 2002324792 | 11/2002 |
| JP | 2002-367770 | 12/2002 |
| JP | 2003-142277 | 5/2003 |
| JP | 2003-234186 | 8/2003 |
| JP | 2003-528421 | 9/2003 |
| JP | 2003-324792 | 11/2003 |
| JP | 2004-253390 | 9/2004 |
| WO | 98/13725 | 4/1998 |
| WO | 00/35028 | 6/2000 |
| WO | 00/076010 | 12/2000 |
| WO | 01/06576 | 1/2001 |
| WO | 01/39554 | 5/2001 |

OTHER PUBLICATIONS

European Patent Office, Extended European Search Report issued in connection with European Patent Application No. 12004572.9, dated Sep. 7, 2012. (7 pages).
European Search Report for corresponding EP04773280.5-1235 dated May 18, 2010.
Extended European Search Report dated Feb. 15, 2017 in corresponding European Application No. 16199062.7.
European Search Report dated Jan. 28, 2019 in corresponding European Application No. 18200213.9.
Extended European Search Report dated Oct. 15, 2018 in corresponding European Application No. 18171477.5.

* cited by examiner

DISPLAY UNIT

CROSS REFERENCE TO RELATED APPLICATIONS

This application is a continuation of U.S. patent application Ser. No. 15/912,527, filed on Mar. 5, 2018, which application is a continuation of U.S. patent application Ser. No. 15/432,395, filed Feb. 14, 2017, which issued as U.S. Pat. No. 9,911,792 on Mar. 6, 2018, which application is a continuation of U.S. patent application Ser. No. 15/177,577, filed Jun. 9, 2016, which issued as U.S. Pat. No. 9,627,453 on Apr. 18, 2017, which application is a continuation of U.S. patent application Ser. No. 14/749,282, filed Jun. 24, 2015, which issued as U.S. Pat. No. 9,373,672 on Jun. 21, 2016, which application is a continuation of U.S. patent application Ser. No. 14/339,987, filed Jul. 24, 2014, which issued as U.S. Pat. No. 9,123,666 on Sep. 1, 2015, which application is a continuation of U.S. patent application Ser. No. 13/786,808, filed Mar. 6, 2013, which is a continuation of U.S. patent application Ser. No. 13/160,205, filed Jun. 14, 2011, which issued as U.S. Pat. No. 8,415,686 on Apr. 9, 2013, which is a divisional of U.S. patent application Ser. No. 10/571,845, filed on Mar. 15, 2006, which issued as U.S. Pat. No. 7,973,319 on Jul. 5, 2011, which is the U.S. national stage designation of International Application No. PCT/JP04/013647 filed on Sep. 17, 2004, which claims priority to JP2003-327497, filed Sep. 19, 2003, JP2003-328989, filed Sep. 19, 2003 and JP2004-261506 filed Sep. 8, 2004, the entire contents of which are being incorporated herein by reference.

BACKGROUND

The present disclosure relates to a display unit, a manufacturing method thereof, an organic light emitting unit, and a manufacturing method thereof. The present invention particularly relates to a surface light emitting type display unit, in which light emitting devices such as an organic EL device are arranged and formed on the substrate and a desire light emitting color can be selectively extracted, a manufacturing method thereof, an organic light emitting unit, and a manufacturing method thereof.

In recent years, as a display unit taking the place of the cathode ray tube (CRT), research and development of light weighted and small flat display units with small electric power consumption has been actively implemented. Of the foregoing, a display unit using an organic light emitting unit including a self-light emitting display device (so-called light emitting device) such as an inorganic EL device and an organic EL device attracts attention as a display unit capable of being driven with low electric power consumption.

As a configuration for providing a full-color display unit using such light emitting devices, for example, (1) a configuration in which light emitting devices for emitting blue light, green light, and red light are arranged, (2) a configuration in which a color filter is combined with a white light emitting device, (3) a configuration in which a color conversion filter is combined with a white light emitting device or a blue light emitting device and the like have been proposed.

Of the foregoing, in the configuration (1), a configuration in which high efficiency by interference of light extracted from each light emitting device is attained by adjusting the film thickness of the transparent electrode on the glass substrate on the light extraction side for every blue, green, and red light emitting device has been further proposed (refer to Japanese Unexamined Patent Application Publication No. 2003-142277).

Further, in the configuration (1), it is proposed that a light emitting device structure in which a function layer including a light emitting layer is sandwiched between a reflecting electrode and a semi-transparent material layer is adopted, and a resonator structure in which light generated in the light emitting layer is multiple-interfered between the reflecting electrode and the semi-transparent material layer and is extracted from the semi-transparent material layer side is used. By adopting such a configuration, color purity of extracted light can be improved, and extraction intensity in the vicinity of the central wavelength of resonance can be improved. Therefore, in the display unit in which light emitting devices having the peak in the respective blue, green and red wavelengths are arranged in parallel, when the display unit is structured by setting the optical distance of the resonator structure in the respective light emitting devices according to the wavelengths of extracted light from the respective blue, green, and red light emitting devices, improvement of front luminance and improvement of color purity have been attained. Further, by extracting emitted light through color filters, high quality display units with still higher color purity and small view angle dependence, in which contrast lowering due to panel surface reflection is prevented has been attained (refer to International Publication No. WO01-039554).

For the configuration for obtaining a full-color display unit using light emitting devices, some related arts have been proposed. Specifically, in order to improve emission efficiency of light emitted from the light emitting devices, the technique to change, of the function layer including a light emitting layer, the thickness of layers other than the light emitting layer for each color has been known (refer to Japanese Unexamined Patent Application Publication No. 2000-323277). In the configuration, based on the difference in thickness among layers other than the light emitting layer, that is, based on the difference in light path lengths in the light emission process, light emission efficiency is improved for every color by utilizing light interference phenomenon. Further, in order to lower resistance of the electrode layer (transparent electrode), the technique to insert a metal film (for example, silver (Ag) being 50 nm or less thick) in the electrode layer has been known (refer to Japanese Unexamined Patent Application Publication No. 2002-324792). In the configuration, resistance of the electrode layer is lowered by utilizing conductivity characteristics of the metal thin film. Further, in order to effectively generate high-luminance white light, the technique in which a light emitting layer is structured by layering a blue light emitting layer for generating blue light, a green light emitting layer for emitting green light, and a red light emitting layer for generating red light has been known (refer to Japanese Unexamined Patent Application Publication No. H10-003990). In the configuration, based on the structural characteristics of the light emitting layer structured by layering the blue light emitting layer, the green light emitting layer, and the red light emitting layer, white light luminance is improved, and generation efficiency of the white light is improved.

However, in the foregoing configuration according to (1), since the respective light emitting devices for emitting blue light, green light, and red light are arranged on the substrate, the light emitting layer and the function layer including the light emitting layer in the light emitting device of each color should be respectively formed. For example, when organic EL devices are used as a light emitting device, not only the light emitting layer, but also the function layer of the electron injection layer, the electron transport layer, the hole injection layer, and the hole transport layer should be respectively designed according to the light emitting layers in some cases. Therefore, designing and forming the function layer in the light emitting device of each color have been very complicated. Further, in manufacturing such a light emitting device, the function layer including the light emitting layer is pattern formed by vapor deposition or coating using a metal mask, furthermore by inkjet. However, when vapor deposition or coating using a metal mask is performed, there is a limit of alignment accuracy of the metal mask. When inkjet is used, there is a limit of the patterning precision. Therefore, it is hard to miniaturize and jumboize the light emitting device and space between the light emitting devices. Further, the foregoing limits are the cause of preventing realization of the display unit capable of higher definition display.

Meanwhile, in the configurations of (2) and (3), since light in the same wavelength region may be emitted in each light emitting device, it is not necessary to separately form the function layer including the light emitting layer for every color. Therefore, the manufacturing steps including designing each light emitting device is simpler than of the configuration according to (1). However, in the configuration of (2), the color filter absorbs unnecessary light emitting component, and therefore light emission efficiency is lowered, leading to large load on the electric power consumption and device life. Further, it is difficult to provide filtering white light emission in the light emitting device into blue, green, and red with favorable color purity by transmission characteristics of the color filters capable of being mass-produced, and only the display unit in which the extracted light has a wide wavelength distribution and poor color reproducibility can be produced. Further, in the configuration of (3), there are problems of low conversion efficiency of the color conversion filters, difficulty of manufacturing the color conversion filters, life of the color conversion filters, color purity of emitted light colors after color conversion and the like, and therefore it is hard to put the configuration in practical use.

SUMMARY

In view of the foregoing, it is an object of the present invention to provide a display unit in which designing and manufacturing can be simplified by simpler light emitting device structure, and high definition display and superior color reproducibility are enabled, a manufacturing method thereof, an organic light emitting unit, and a manufacturing method thereof.

A display unit according to a first aspect of the present invention for attaining such an object is a display unit, wherein a plurality of light emitting devices in which a function layer including at least a light emitting layer is sandwiched between a mirror made of a light reflective material and a light semi-transmissive half mirror, and which have a resonator structure for resonating light emitted in the light emitting layer by using a space between the mirror and the half mirror as a resonant section and extracting the light from the half mirror side are arranged on a substrate. Further, in particular, in the respective light emitting devices, the light emitting layer is made of an identical layer, and the optical distance of the resonant section between the mirror and the half mirror is set to a plurality of different values.

In the display unit with such a configuration, light in wavelength regions corresponding to the optical distance of the resonant section between the mirror and the half mirror set for the respective light emitting devices is extracted in a state of being intensified by resonance from the respective light emitting devices having the light emitting layer made of the identical layer. Therefore, while the light emitting layer with the identical structure is used, by designing the optical distance between the mirror and the half mirror in the respective light emitting devices so that extraction efficiency of desired light emitting wavelengths becomes the maximum, light of different light emission color with sufficient intensity is extracted from the respective light emitting devices.

Therefore, by arranging the respective light emitting devices, in which the optical distance between the mirror and the half mirror is adjusted so that extraction of blue, green, and red light emission becomes the maximum, a full-color display unit can be obtained.

Further, by forming the light emitting layer of the respective light emitting devices from the identical layer, the whole function layer including the light emitting layer can be an identical structure. Therefore, it is not necessary to separately form the whole function layer for every light emitting color of the light emitting device, it is not necessary to set adjustment tolerance between the respective function layers between the light emitting devices necessary when the function layer is separately formed, leading to a narrowed pitch between each pixel.

Further, when the whole function layer including the light emitting layer is made of the identical layer, the mirror and the half mirror are structured as an electrode, a transparent conductive film is sandwiched together with the function layer between the mirror and the half mirror, and the optical distance between the mirror and the half mirror is adjusted by the transparent conductive film. The transparent electrode film is pattern-formed by etching using as a mask resist patterns formed by lithography process, and therefore favorable patterning precision can be obtained compared to the function layer requiring pattern formation by using a metal mask or by inkjet.

In particular, since the reflectance of the half mirror is in the range from 0.1% to less than 50%, effects of the resonant structure can be appropriately inhibited. Therefore, in the direct view type display unit, view angle dependence of luminance and chromaticity based on the resonator structure is appropriately reduced. Specifically, when the reflectance of the half mirror is 50% or more, resonant effect of the resonator structure is too strong, and therefore the half value width of the spectrum of light to be extracted from the resonant section becomes too narrow, resulting in large view angle dependence of the display unit. Meanwhile, when the reflectance of the half mirror is in the range from 0.1% to less than 50%, the resonant effect of the resonator structure is appropriately inhibited, and therefore the half value width of the spectrum of light to be extracted from the resonant section becomes appropriately widened, resulting in small view angle dependence of the display unit. That is, in order to configure the display unit capable of displaying stably not depending on the view angle, the reflectance of the half mirror is preferably in the range from 0.1% to less than 50%, rather than the range of 50% or more. Further, when the reflectance of the half mirror is in the range from 0.1% to less than 50%, by providing a color filter transmitting light in the wavelength regions, which is resonated in the resonant section and extracted from the half mirror side above the half mirror, view angle dependence of luminance and chromaticity in the direct view type display unit is further appropriately reduced by the color filter, and therefore display performance is improved.

In addition to that the reflectance of the half mirror is in the range from 0.1% to less than 50%, the color filter is provided above the half mirror, the mirror and the half mirror are structured as an electrode, and the transparent conductive layer together with the function layer are sandwiched between the mirror and the half mirror, when an optical distance L is in the range meeting the following formula (1) (in the formula (1), φ represents a phase shift (radian) generated when emitted light generated in the light emitting layer is reflected on the both ends of the resonant section, L represents an optical distance of the resonant section, and λ represents a peak wavelength of the spectrum of light desired to be extracted among the light) and when an optical distance Lt is set to meet the following formula (2) (in the formula (2), Lt represents an optical distance of the transparent conductive layer, and Lf represents an optical distance of the function layer including the light emitting layer), the optical distances Lt and Lf in the foregoing formula (2) are set so that the value of m in the formula (1) meets one combination of m=0, 0, 0, m=1, 0, 0, m=1, 1, 0, m=1, 1, 1, m=2, 1, 1, m=2, 2, 1, and m=2, 2, 2, respectively for the light emitting device for emitting blue light of the light emitting devices, the light emitting device for emitting green light of the light emitting devices, and the light emitting device for emitting red light of the light emitting devices. Thereby, view angle dependence of luminance and chromaticity is appropriately reduced while selection of the light emitting wavelength and improvement of the maximum wavelength by the resonator structure are secured.

$$(2L)/\lambda + \varphi/(2\pi) = m \text{ (}m\text{ is an integer)} \quad (1)$$

$$Lt = L - Lf \quad (2)$$

A method of manufacturing the display unit according to the first aspect of the present invention is a method of manufacturing the display unit with the foregoing configuration, wherein after the mirror or the half mirror is formed in the formation regions of the respective light emitting devices on the substrate, a step of pattern-forming transparent conductive films with an optical distance different from each other and a step of forming the light emitting layer in block are performed in this order or in the order opposite thereof.

In such a manufacturing method, on the mirror or the half mirror in the formation regions of the respective light emitting devices, the light emitting device provided with a lamination of the light emitting layer becoming the identical structure by being formed in block and the transparent conductive film having a different optical distance is formed. Further, since the light emitting layers are made as the identical layer by forming in block, the whole function layer including the light emitting layer can be formed in block, leading to reduction in the number of manufacturing steps including designing the function layer.

In particular, the half mirror is formed so that the reflectance is in the range from 0.1% to less than 50%. Therefore, as described above, by appropriately inhibiting effects of the resonator structure, view angle dependence of luminance and chromaticity based on the resonator structure for the direct view type display unit can be appropriately reduced.

Further, an organic light emitting unit according to the present invention is an organic light emitting unit including three organic light emitting devices provided on a substrate, wherein the three organic light emitting devices have a structure in which a first electrode layer, a layer including a light emitting layer, and a second electrode layer are layered from the substrate side, and convert light generated in the light emitting layer to light of three colors different from each other and emit the converted light. Further, in particular, the first electrode layer has a structure in which a contact layer for improving contact characteristics with the substrate, a resonant layer for resonating light generated in the light emitting layer between the resonant layer and the second electrode layer, and a barrier layer for protecting the resonant layer are layered from the substrate side, and the thickness of the barrier layer is different from each other among the three organic light emitting devices.

In the organic light emitting unit with such a configuration, the thickness of the barrier layer composing the first electrode layer is different from each other among the three organic light emitting devices. Therefore, for example, when light of color equal to each other among the three organic light emitting devices is generated in the light emitting layer, it is possible to convert the light generated in the light emitting layer to three color light for image display (red light, green light, and blue light) by utilizing light interference phenomenon resulting from the difference of the resonant length among the three organic light emitting devices based on the difference of the thickness of the barrier layer.

Further, a method of manufacturing an organic light emitting unit according to the present invention is a method of manufacturing an organic light emitting unit including three organic light emitting devices provided on a substrate, wherein the three organic light emitting devices have a structure in which a first electrode layer, a layer including a light emitting layer, and a second electrode layer are layered from the substrate side, and convert light generated in the light emitting layer to light of three colors different from each other and emit the converted light. Further, in particular, in the method, a step of forming the first electrode layer so that the first electrode layer has a structure in which a contact layer for improving contact characteristics with the substrate, a resonant layer for resonating light generated in the light emitting layer between the resonant layer and the second electrode layer, and a barrier layer for protecting the resonant layer are layered from the substrate side is included, and the thickness of the barrier layer is different from each other among the three organic light emitting devices.

In such a manufacturing method, for forming the first electrode layer having the characteristic structure that the thickness of the barrier layer is different from each other among the three organic light emitting devices continuously and with good reproducibility, only the existing thin film process is used, and a new and complicated manufacturing process is not used.

Further, a display unit according to a second aspect of the present invention is a display unit including an organic light emitting unit having a structure in which three organic light emitting devices are provided on a substrate, wherein the three organic light emitting devices of the organic light emitting unit have a structure in which a first electrode layer, a layer including a light emitting layer, and a second electrode layer are layered from the substrate side, and images are displayed by converting light generated in the light emitting layer to light of three colors different from each other and emitting the converted light. In particular, the first electrode layer has a structure in which a contact layer for improving contact characteristics with the substrate, a resonant layer for resonating light generated in the light emitting layer between the resonant layer and the second electrode layer, and a barrier layer for protecting the resonant layer are layered, and the thickness of the barrier layer is different from each other among the three organic light emitting devices.

In the display unit with such a configuration, since the display unit includes the foregoing organic light emitting unit. Therefore, it is not necessary to separately coat the light emitting layer by using a metal mask in manufacturing the display unit, and it is not necessary to convert light generated in the light emitting layer to other colors by color filters. Thereby, the display size can be jumboized, and utilization efficiency of light can be secured.

DETAILED DESCRIPTION

Embodiments of the present invention will be hereinafter described in detail with reference to the drawings.

First Embodiment

Figure 1:
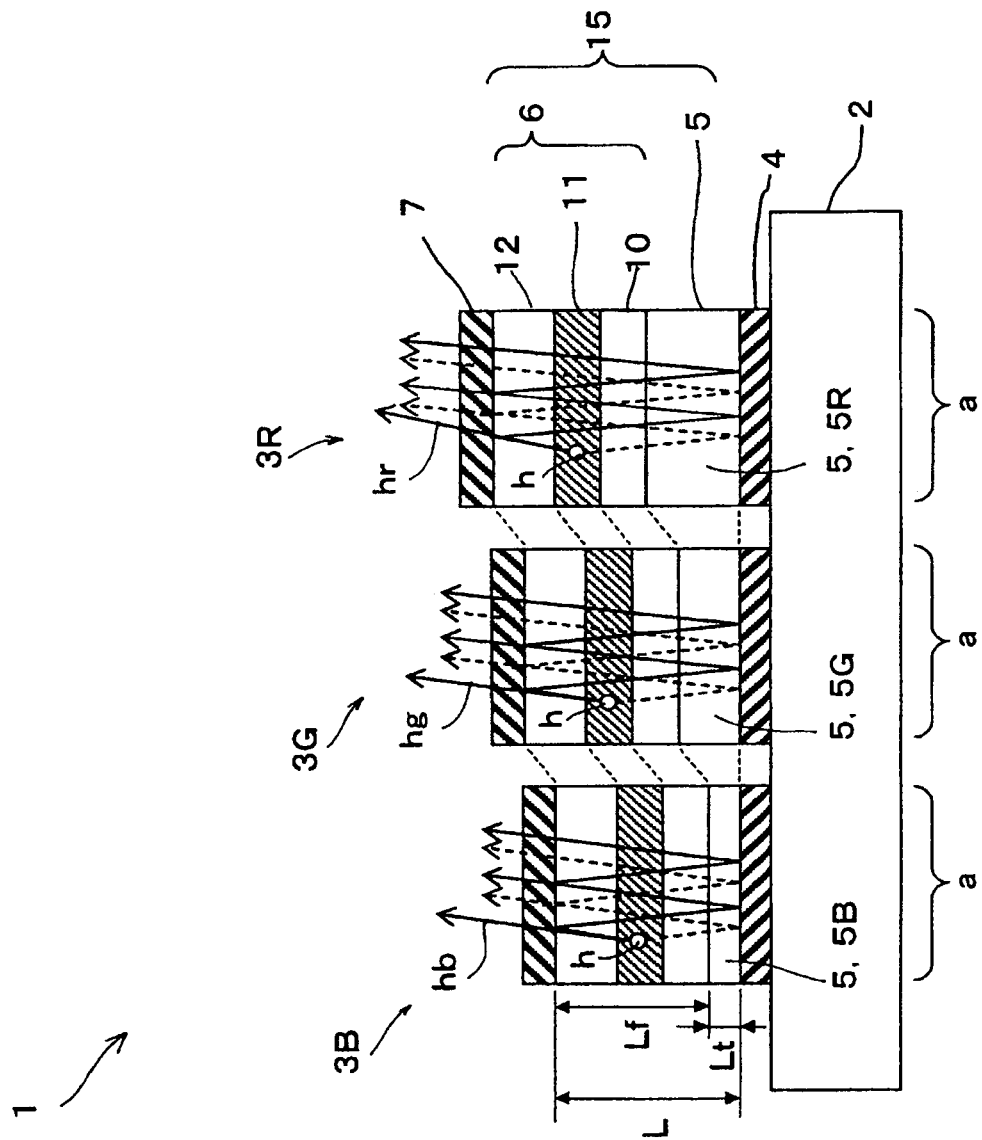
FIG. 1 is a cross section showing a cross sectional configuration of a display unit according to a first embodiment of the present invention.

First, descriptions will be given of a display unit according to a first embodiment of the present invention with reference to FIG. 1. FIG. 1 is a cross section showing a model of a configuration example of the display unit according to this embodiment. A display unit 1 shown in the figure is a full color display unit in which each organic EL device 3B, 3G, and 3R, from which light of each color of blue (B), green (G), and red (R) is extracted, is arranged and formed on a substrate 2. The display unit 1 displays images by utilizing organic EL phenomenon. Each organic EL Device 3B, 3G, and 3R has a configuration in which a lower electrode 4, a transparent conductive layer 5, a function layer 6, and an upper electrode 7 are layered from the substrate 2 side. The display unit is configured as a top emission type display unit in which emitted light h generated in the function layer 6 is extracted from the upper electrode 7 side opposite of the substrate 2. Detailed structures of respective members will be hereinafter described.

The substrate 2 is made of, for example, glass, silicon, a plastic substrate, further a TFT substrate on which a thin film transistors (TFT) are formed or the like.

The lower electrode 4 provided on the substrate 2 is structured as a mirror by using a conductive material with superior light reflectivity. In general, the lower electrode 4 is used as an anode or a cathode. In this embodiment, since the function layer 6 is provided above the lower electrode 4 with the transparent conductive layer 5 in between, the transparent conductive layer 5 becomes an anode or a cathode practically. Therefore, in this embodiment, the lower electrode 4 may be made of a material with superior reflectivity.

Further, the lower electrode 4 shall be provided with patterning in the shape suitable for the driving method of the display unit 1. For example, when the driving method is simple matrix type, the lower electrode 4 is formed in a state of stripes, for example. Further, when the driving method is active matrix type including a TFT for every pixel a, the lower electrode 4 is pattern-formed correspondingly to each of a plurality of arranged pixels a. In this case, each lower electrode 4 is connected to a TFT similarly provided for each pixel through a contact hole (not shown) formed in the interlayer insulating film covering the TFTs.

The transparent conductive layer 5 provided on the lower electrode 4 is made of a transparent electrode material, and particularly in this embodiment, is used as an anode or a cathode practically as described above. When the transparent conductive layer 5 is used as an anode, a transparent conductive material with a large work function is selected. When the transparent conductive layer 5 is used as a cathode, a transparent conductive material with a small work function is selected. In FIG. 1, the case using the transparent conductive layer 5 as an anode is representatively shown. The transparent conductive layer 5 becoming an anode by using, for example, indium tin oxide (ITO) shall be provided.

The transparent conductive layer 5 is provided with patterning with each film thickness (optical distance Lt) in each organic EL device 3B, 3G, and 3R. The transparent conducive layer 5 (5B, 5G, and 5R) provided for each organic EL device 3B, 3G, and 3R may have the respectively set optical distance Lt, and is not necessarily made of the same material. Details of setting the optical distance Lt of each transparent conductive layer 5B, 5G, and 5R will be described later.

The function layer 6 layered on the transparent conductive layer 5 includes a plurality of layers made of an organic material. For example, in the function layer 6, a hole transport layer 10, a light emitting layer 11, and an electron transport layer 12 are layered from the anode side (in FIG. 1, the transparent conductive layer 5 side) and is provided as an identical layer among each organic EL device 3B, 3G, and 3R. Further, the function layer 6 may be pattern-formed for every pixel a, or may be formed in a state of overall film.

Here, in order to obtain full color display in the display unit 1 of this embodiment, the emitted light h generated in a light emitting layer 11 should have light emitting intensity in blue, green, and red wavelength regions. In particular, it is preferable that the function layer 6 has the maximum light emitting intensity in all wavelength regions desired to be extracted of blue, green, and red and has small light emitting intensity in unnecessary wavelength regions. By using such a function layer 6, a display unit with high light extraction efficiency in necessary light emitting regions and high color purity can be obtained. The structure of such a function layer 6 can be voluntarily selected from known structures and the like.

It is important that a film thickness of the function layer 6 (optical distance Lf) is set as described below in detail so that the space between the lower electrode 4 and the upper electrode 7, that is the total thickness of the function layer 6 and the transparent conductive film 5 becomes a resonant section 15 for resonating the targeted wavelength.

The upper electrode 7 provided on such a function layer 6 is structured as a half mirror. The upper electrode 7 is used as a cathode when the lower electrode 4 (transparent conductive layer 5) is an anode, or used as an anode when the lower electrode 4 (transparent conductive layer 5) is a cathode. When the upper electrode 7 is used as an anode, as a material making the upper electrode 7, a conductive material with high work function such as nickel, silver, gold, platinum, palladium, selenium, rhodium, ruthenium, iridium, rhenium, tungsten, molybdenum, chromium, tantalum, niobium, an alloy thereof, tin oxide ($SnO_2$), indium tin oxide (ITO), zinc oxide, and titanium oxide is selectively used. Further, when the upper electrode 7 is used as a cathode (as in FIG. 1), as a material making the upper electrode 7, for example, a conductive material with small work function such as an alloy of an active metal such as Li, Mg, and Ca and a metal such as Ag, Al, and In is selectively used, or such conductive materials may be layered. Further, it is possible that a thin compound layer of an active metal such as Li, Mg, and Ca and halogen such as fluorine and bromine, or oxygen is inserted in the space to the function layer 6. Since the upper electrode 7 is used as a half mirror becoming a side from which emitted light generated in the function layer 6 is extracted, the light transmittance is adjusted by the film thickness and the like.

In particular, the reflectance of the upper electrode 7 structured as a half mirror is preferably in the range from 0.1% to less than 50%. When the reflectance of the upper electrode 7 is in the foregoing range, effect of the resonator structure (resonant section 15) is appropriately inhibited, and therefore in the direct view type display unit 1, view angle dependence of luminance and chromaticity based on the resonant section 15 is appropriately decreased. Specifically, when the reflectance of the upper electrode 7 is 50% or more, resonant effect of the resonant section 15 is too strong, and therefore the half value width of the spectrum of light to be extracted from the resonant section 15 becomes too narrow, resulting in large view angle dependence of the display unit 1. Meanwhile, when the reflectance of the upper electrode 7 is in the range from 0.1% to less than 50%, the resonant effect of the resonant section 15 is appropriately inhibited, and therefore the half value width of the spectrum of light to be extracted from the resonant section 15 becomes appropriately widened, resulting in small view angle dependence of the display unit 1. That is, in order to configure the display unit 1 capable of displaying stably not depending on the view angle, the reflectance of the upper electrode 7 is preferably in the range from 0.1% to less than 50%, rather than in the range of 50% or more. The reason why the lower limit of the reflectance of the upper electrode 7 is preferably "0.1% or more" is that when the reflectance is less than 0.1%, the upper electrode 7 no longer carries out the reflection function.

Further, when the display unit 1 is a simple matrix type display unit, the upper electrode 7 is formed in a state of stripe intersecting the stripe of the lower electrode 4. The layered intersection thereof becomes the organic EL devices 3B, 3G, and 3R. Further, when the display unit 1 is an active matrix type display unit, the upper electrode 7 may be a film deposited so that the film covers the whole area of the substrate 2, and is used as a common electrode for each pixel.

An unshown driving power source for the purpose of current injection is connected between the upper electrode 7 and the foregoing lower electrode 4.

Next, an optical distance L of the resonant section 15 between the lower electrode 4 and the upper electrode 7 and the optical distance Lt of the transparent conductive layers 5B, 5G, and 5R in each organic EL device 3B, 3G, and 3R will be described.

That is, in each organic EL device 3B, 3G, and 3R, the optical distance L of the resonant section 15 between the lower electrode 4 and the upper electrode 7 is respectively set to the value at which light in the desired wavelength region set for each organic EL device 3B, 3G, and 3R is resonated on the both ends of the resonant section 15. Therefore, for example, where a phase shift generated when the emitted light h generated in the light emitting layer 11 is reflected on the both ends of the resonant section 15 is φ radian, the optical distance of the resonant section 15 is L, and a peak wavelength of the spectrum of light desired to be extracted among the emitted light h generated in the light emitting layer 11 is λ, the optical distance L of the resonant section 15 shall be in the range meeting the following formula (1).

$$(2L)/\lambda + \varphi/(2\pi) = m \text{ (}m\text{ is an integer)} \quad (1)$$

Then, for the organic EL device 3B, the peak wavelength λ=460 nm is set in the blue region as the peak wavelength λ of the spectrum of light desired to be extracted, and the optical distance L of the resonant section 15 is calculated. Further, for the organic EL device 3G, the peak wavelength λ=530 nm is set in the green region as the peak wavelength λ of the spectrum of light desired to be extracted, and the optical distance L of the resonant section 15 is calculated. Further, for the organic EL device 3R, the peak wavelength λ=630 nm is set in the red region as the peak wavelength λ of the spectrum of light desired to be extracted, and the optical distance L of the resonant section 15 is calculated.

The optical distance L of each resonant section 15 is enough to be a value meeting the foregoing formula (1), however, in particular, the optical distance L is preferably the positive minimum value. For the case that "the optical distance L of each resonant section 15 is the positive minimum value," descriptions will be hereinafter given in detail.

In each organic EL device 3B, 3G, and 3R, the function layer 6 including the light emitting layer 11 is made of the identical layer. Therefore, the optical distance L of the resonant section 15 is adjusted by the optical distance Lt of each transparent conductive layer 5B, 5G, and 5R. In the result, where the optical distance of the transparent conductive layers 5B, 5G, and 5R is Lt, and the optical distance of the function layer 6 including the light emitting layer 11 is Lf, the optical distance Lt (film thickness) of the transparent conductive layers 5B, 5G, and 5R of each organic EL device 3B, 3G, and 3R shall be set to meet the following formula (2).

$$Lt = L - Lf \quad (2)$$

where Lf is a certain value smaller than L.

Though not shown in the figure, when color filters are combined with the display unit 1 having such a configuration, color filters which transmit only the light h in the vicinity of the peak wavelength λ of the spectrum desired to be extracted from each organic EL device 3B, 3G, and 3R are provided on the light extraction face side of each organic EL device 3B, 3G, and 3R.

Here, the case that "the optical distance L of each resonant section 15 is the positive minimum value in the range to meet the foregoing formula (1)" is the case that the optical distances Lt and Lf in the foregoing formula (2) are set so that the value of m in the formula (1) meets m=0 for the organic EL device 3B for emitting light hb in the blue wavelength region; m=0 for the organic EL device 3G for emitting light hg in the green wavelength region; and m=0 for the organic EL device 3R for emitting light hr in the red wavelength region. However, the optical distances Lt and Lf in the foregoing formula (2) may be set so that the value of m in the formula (1) meets the conditions that m=1 for the organic EL device 3B, m=0 for the organic EL device 3G, and m=0 for the organic EL device 3R; conditions that m=1 for the organic EL device 3B, m=1 for the organic EL device 3G, and m=0 for the organic EL device 3R; conditions that m=1 for the organic EL device 3B, m=1 for the organic EL device 3G, and m=1 for the organic EL device 3R; conditions that m=2 for the organic EL device 3B, m=1 for the organic EL device 3G, and m=1 for the organic EL device 3R; conditions that m=2 for the organic EL device 3B, m=2 for the organic EL device 3G, and m=1 for the organic EL device R; or conditions that m=2 for the organic EL device 3B, m=2 for the organic EL device 3G, and m=2 for the organic EL device 3R, in addition to the foregoing conditions that m=0 for the organic EL device 3B, m=0 for the organic EL device 3G, and m=0 for the organic EL device 3R. In this case, when the mirror and the half mirror which are identical to each other are used, the larger the value of m becomes, the smaller the half value width of light to be extracted from the resonator structure (resonant section 15) becomes, resulting in improved color purity of light to be extracted from the resonant section 15, but resulting in lowered luminance and increased view angle dependence. Therefore, it is possible that the intensity, the color purity, and the view angle dependence of light to be extracted from the resonant section 15 are corrected by lowering the reflectance of the half mirror or increasing the transmittance thereof. In the conditions of m=1 for the organic EL device 3R, blue light corresponding to the conditions of m=2 is also extracted from the organic EL device 3R together. In the conditions of m=2 for the organic EL device 3R, blue light corresponding to the conditions of m=3 is also extracted from the organic EL device 3R together. Therefore, in these cases, color filters are necessary in order to secure favorable display performance.

In the display unit according to this embodiment, each organic EL device 3B, 3G, and 3R having the function layer 6 formed as the identical layer is respectively structured as a resonator structure for resonating each wavelength of blue, green and red. Thereby, even if the identically structured light emitting layer is used, only light hb, hg, and hr of each wavelength of blue, green, or red can be intensified by multiple interference and extracted from each organic EL device 3B, 3G, and 3R. Therefore, a display unit capable of full color display is configured.

Further, since the light hb, hg, and hr to be extracted from each organic EL device 3B, 3G, and 3R is resonated in the resonant section 15 of each organic EL device 3B, 3G, and 3R and extracted, only light in desired wavelength regions corresponding to blue, green, and red is extracted with sufficient intensity. Therefore, full color display with excellent color reproducibility is enabled.

In particular, since the reflectance of the upper electrode 7 structured as a half mirror is in the range from 0.1% to less than 50%, effects of the resonant section 15 can be appropriately inhibited. In the result, in the direct view type display unit 1, view angle dependence of luminance and chromaticity based on the resonant section 15 is appropriately decreased. Therefore, selectivity and light intensity of extracted light of the front of the display unit 1 can be increased, and view angle dependence of luminance and chromaticity can be maintained low. In this case, when color filters for transmitting light in the wavelengths, which is resonated in the resonant section 15 and extracted from the half mirror side are provided above the upper electrode 7 structured as a half mirror, the foregoing view angle dependence of luminance and chromaticity is further appropriately decreased by the color filters in the direct view type display unit 1. In the result, display performance can be improved.

Furthermore, as described above, in each organic EL device 3B, 3G, and 3R, the whole function layer 6 including the light emitting layer 11 is made of the identical layer. Therefore, it is not necessary to separately form the function layer 6 formed by vapor deposition method using a metal mask or inkjet method for every organic EL device 3B, 3G, and 3R. Therefore, it is not necessary to set adjustment tolerance between each function layer 6 between each pixel a, which is necessary when the function layer 6 is separately formed, leading to a narrowed pitch between each pixel a. The optical distance L in each organic EL device 3B, 3G, and 3R is adjusted by the optical distance Lt of the transparent conductive films 5B, 5G, and 5R. Therefore, the transparent conducive films 5B, 5G, and 5R need to be separately formed. However, the transparent conductive films 5B, 5G, and 5R are pattern-formed by etching using a resist pattern formed by lithography process as a mask. Therefore, patterning precision is more favorable than in the function layer 6 needed to be pattern-formed by using a metal mask or pattern-formed by inkjet.

By realizing miniaturization of the pitch between each pixel a as above, high definition full color display becomes enabled.

Further, since the light emitting layer 11 is made of the identical layer, the function layer 6 made of an organic material with a particularly large film thickness is no longer set. Therefore, a phenomenon that a driving voltage of only some organic EL devices is increased does not occur, and electric power consumption is reduced. In addition, a driving circuit design considering driving conditions different among each color organic EL device is not necessary.

When the optical distance L of each resonant section 15 is the positive minimum value in the range meeting the foregoing formula (1), as disclosed in International Publication WO01-039554, the spectrum of light to be extracted is maintained in the widest width in the range that light of the wavelength λ is multiple-interfered. Therefore, in the display device, while the spectrum of light to be extracted is maintained in a certain width, the peak intensity is improved by multiple interference. In the result, in the display device, even if the view angle is deviated, the shift amount of the wavelength λ is maintained small, and the color purity is improved in a wide view angle range. Specifically, when the optical distances Lt and Lf in the formula (2) are set so that the value of m in the formula (1) meets one of m=0, 0, 0; m=1, 0, 0; m=1, 1, 0; m=1, 1, 1; m=2,1,1; m=2, 2, 1; and m=2, 2, 2 for the organic EL device 3B, the organic EL device 3G, and the organic EL device 3R, selection of light emitting wavelength and increase in the maximum wavelength by the resonator structure (resonant section 15) can be secured, while view angle dependence of luminance and chromaticity based on the resonant section 15 can be appropriately decreased.

Next, as a method of manufacturing a display unit according to this embodiment, a method of manufacturing the display unit 1 with the foregoing configuration will be described.

First, the electrode material film making the lower electrode 4 is deposited on the substrate 2. On the electrode material film, each transparent conductive layer 5B, 5G, and 5R having the optical distance Lt set for every organic EL device formed in each element section is pattern-formed. The pattern formation method of each transparent conductive layer 5B, 5G, and 5R is not particularly limited. When each transparent conductive layer 5B, 5G, and 5R is made of the same material, the pattern formation thereof is performed as follows.

First, a first transparent conductive material film is formed with the same film thickness as a film thickness of the transparent conductive layer 5B with the smallest optical distance Lt, and a first resist pattern is formed in a state that the first resist pattern covers only the pixel a in which the organic EL device 3B is arranged. Next, a second transparent conductive material film is formed so that the total film thickness of the first and the second transparent conductive material films becomes the same film thickness as a film thickness of the transparent conductive layer 5G with the second smallest optical distance Lt, and a second resist pattern is formed in a state that the second resist pattern covers only the pixel a in which the organic EL device 3G is arranged. Further, a third transparent conductive material film is formed so that the total film thickness of the first, the second, and the third transparent conductive material films becomes the same film thickness as a film thickness of the transparent conductive layer 5R with the largest optical distance Lt, and a third resist pattern is formed in a state that the third resist pattern covers the pixel in which the organic EL device 3R is arranged.

Next, the third transparent conductive material film is etched by using the third resist pattern as a mask. Subsequently, when the second resist pattern is exposed, the second transparent conductive material film is etched by using the second resist pattern and the third resist pattern as a mask. Still subsequently, when the first resist pattern is exposed, the first transparent conductive material film is etched by using the first resist pattern, the second resist pattern, and the third resist pattern as a mask. Thereby, the transparent conductive layer 5B made of the first transparent conductive material film is pattern-formed under the first resist pattern, the transparent conductive layer 5G made of the first transparent conductive material film and the second transparent conductive material film is pattern-formed under the second resist pattern, and the transparent conductive layer 5R made of the first transparent conductive material film, the second transparent conductive material film, and the third transparent conductive material film is pattern-formed under the third resist pattern.

After the transparent conductive layers 5B, 5G, and 5R are pattern-formed as above, the lower electrode 4 is pattern-formed by etching the electrode material film using the first to the third resist patterns as a mask.

After that, over the pattern-formed transparent conductive layers 5B, 5G, and 5R and the pattern-formed lower electrode 4, the hole transport layer 10, the light emitting layer 11, and the electron transport layer 12 are sequentially layered and formed above the substrate 2, and the function layer 6 made of the identical layer is formed for each pixel a in block. Each layer 10 to 12 can be formed by using each organic material synthesized by a known method and by applying a known method such as vacuum vapor deposition and spin coat. Finally, the upper electrode 7 is layered and formed so that the reflectance is in the range from 0.1% to less than 50%. Thereby, the display unit 1 in which the organic EL devices 3B, 3G, and 3R with the foregoing structure are arranged and formed can be obtained.

In the method of manufacturing a display according to this embodiment, in manufacturing the display unit 1 with the foregoing configuration, the function layer 6 including the light emitting layer 11 is formed in block in each organic EL device 3B, 3G, and 3R, and thereby the number of manufacturing steps including designing the function layer can be reduced. Therefore, the display unit 1 capable of high definition display can be realized by miniaturization of the light emitting devices with standardized function layer 6, and capable of display with superior color reproducibility by extracting light of desired light emitting colors with sufficient intensity can be manufactured more simply.

In particular, by forming the half mirror so that the reflectance is in the range from 0.1% to less than 50%, as described above, effect of the resonant section 15 can be appropriately inhibited. In the result, for the direct view type display unit 1, view angle dependence of luminance and chromaticity based on the resonant section 15 can be appropriately reduced. Therefore, the high quality display unit 1 with more superior color reproducibility and small view angle dependence can be realized.

Figure 2:
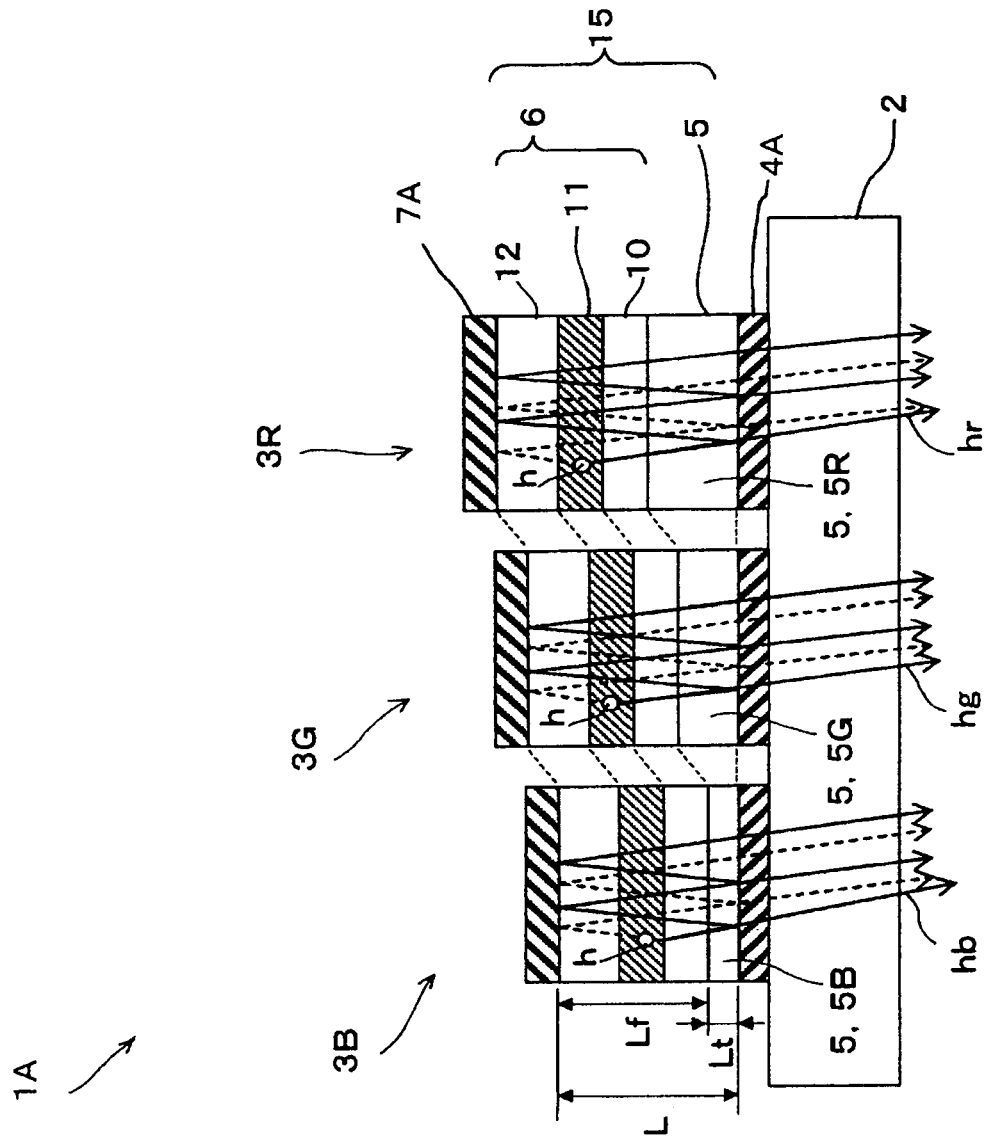
FIG. 2 is a cross section showing another cross sectional configuration of the display unit according to the first embodiment of the present invention.

In the embodiment described above, the structure of the so-called top emission type display unit 1 in which the emitted light h is extracted from the upper electrode 7 side opposite of the substrate 2 and the manufacturing method thereof have been described by using FIG. 1. However, as shown in FIG. 2, the present invention can be applied to a so-called bottom emission type display unit 1A in which the emitted light h is extracted from the substrate 2 side. In this case, the display unit 1A may be configured as in the foregoing embodiment, except that a lower electrode 4A provided on the substrate 2 is structured as a half mirror by using a light reflexible material, and an upper electrode 7A is structured as a mirror by using a material with favorable light reflectivity, and effects similar to of the foregoing embodiment can be obtained. However, when active matrix type is adopted as a driving method of the display unit, it is preferable to improve the aperture ratio of the devices by using the top emission type shown in FIG. 1.

Further, in the foregoing embodiment, the transparent conductive layer 5 is provided on the lower electrode 4 or 4A. However, the transparent conductive layer 5 may be provided between the function layer 6 and the upper electrode 7 or 7A. In this case, the lower electrode 4 or 4A becomes an anode or a cathode practically, and the transparent electrode 5 becomes a cathode or an anode practically instead of the upper electrode 7 or 7A. Further, in the foregoing embodiment, the transparent conductive layer 5 is pattern-formed by using lithography. However, the transparent conductive layer 5 may be pattern-formed by using a method such as a vapor deposition mask and inkjet.

Further, in the foregoing embodiment, an example using each organic EL device, in which the lower electrode and the upper electrode are structured as a mirror and a half mirror, and the space in between is used as a resonant section has been described. However, the display unit of the present invention is not limited to such a configuration. That is, the display unit of the present invention can be configured so that the lower electrode or the upper electrode is structured as a mirror, one of the layers composing the function layer is structured as a half mirror, the light emitting layer 11 made of an identical layer is sandwiched between the mirror and the half mirror, and the optical distance of the resonant section is adjusted by a film thickness of layers composing the function layer other than the light emitting layer 11 sandwiched between the mirror and the half mirror. Further, the mirror and the half mirror may sandwich the light emitting layer 11 from outside of the upper electrode or the lower electrode. In this case, manufacturing steps can be simplified by making the light emitting layer 11 as an identical layer.

Further, in the foregoing embodiment, the configuration of the display unit using the organic EL device as a light emitting device has been described. However, the present invention is not limited to the display unit using the organic EL device, but can be widely applied to display units using a light emitting device capable of being structured as a resonant structure such as an inorganic EL device.

Second Embodiment

Figure 3:
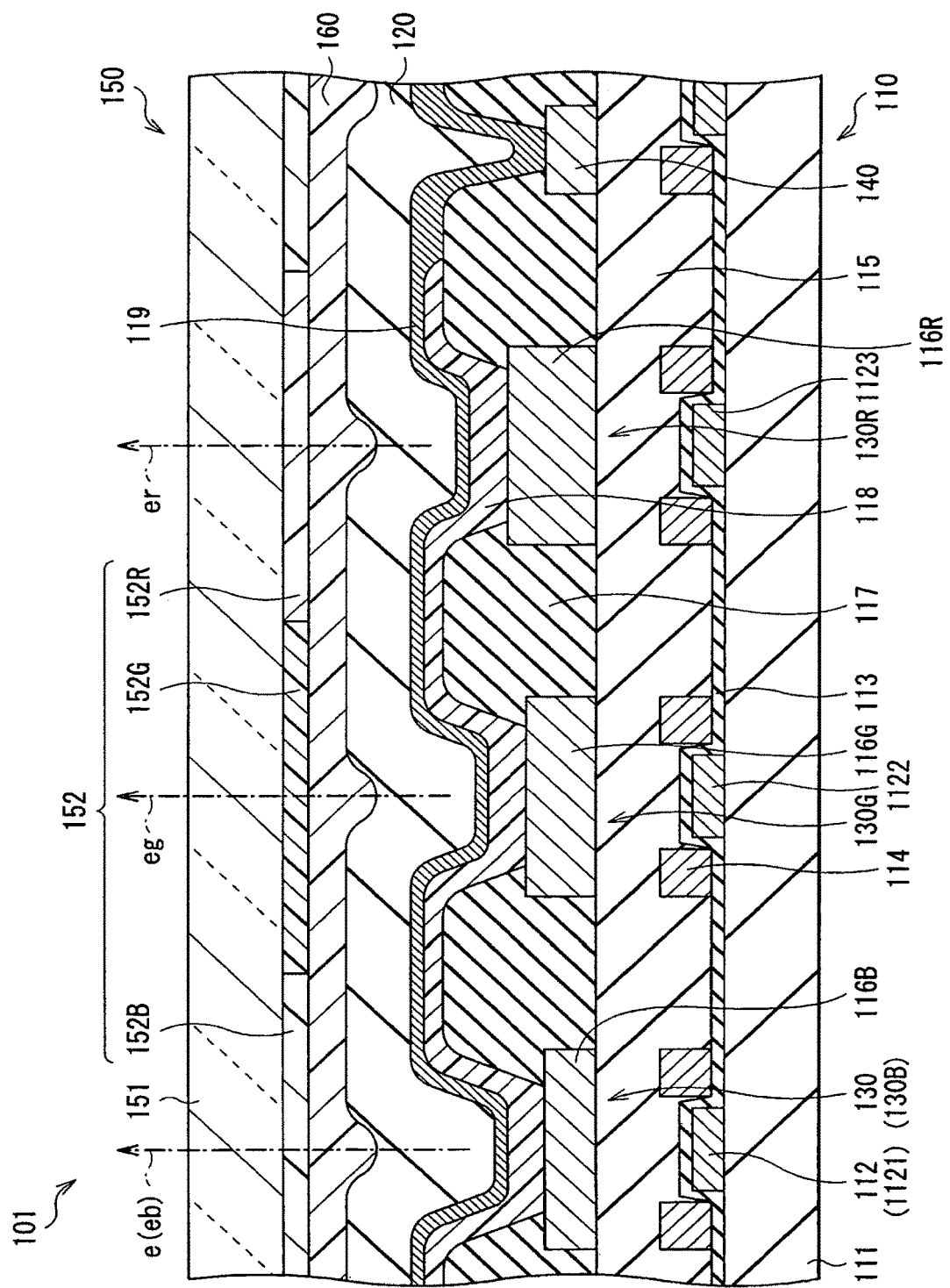
FIG. 3 is a cross section showing a cross sectional configuration of a display unit according to a second embodiment of the present invention.

Next, with reference to FIG. 3, a display unit according to a second embodiment of the present invention will be described. FIG. 3 shows a cross sectional configuration of a display unit 101.

The display unit 101 displays images by utilizing the organic EL phenomenon. For example, as shown in FIG. 3, a driving panel 110 as an organic light emitting unit provided with an organic EL device 130 and a driving device (TFT: Thin Film Transistor) 112 for driving the organic EL device 130 and a sealing panel 150 are oppositely arranged, and the driving panel 110 and the sealing panel 150 are bonded together with an adhesive layer 160 in between so that the organic EL device 130 is sandwiched between the driving panel 110 and the sealing panel 150. The display unit 101 has, for example, a top emission type structure for emitting light e generated in the organic EL device 130 upward, that is, to outside of the sealing panel 150.

The driving panel 110 has a structure in which three organic EL devices 130R, 130G, and 130B are provided as the foregoing organic EL device 130 on a driving substrate 111 as a substrate. The driving panel 110 specifically has a structure in which over the driving substrate 111, three TFTs 1121, 1122, and 1123 as a TFT 112, an interlayer insulating layer 113, a pair of wirings 114 provided for each TFT 1121 to 1123, a planarizing layer 115 as a base region on which the organic EL devices 130R, 130G, and 130B are arranged, the foregoing organic EL devices 130R, 130G, and 130B, an auxiliary wiring 140, an interlayer insulating layer 117, and a protective layer 120 are layered in this order.

The driving substrate 111 is intended to support the organic EL device 130 and the TFT 112, and is made of, for example, an insulating material such as glass.

The TFT 112 (1121, 1122, and 1123) is intended to drive the organic EL device 130 (130R, 130G, and 130B) to emit light. The TFT 112 includes a gate electrode, a source electrode, and a drain electrode, which are not shown in FIG. 3. The gate electrode is connected to a scanning circuit (not shown), and both the source electrode and the drain electrode are connected to the wiring 114 through a connection hole (not shown) provided in the interlayer insulating layer 113. The structure of the TFT 112 is not particularly limited, but for example, the structure thereof may be bottom gate type or top gate type.

The interlayer insulating layer 113 is intended to electrically separate each TFT 1121 to 1123 from each other. For example, the interlayer insulating layer 113 is made of an insulating material such as silicon oxide ($SiO_2$) and PSG (Phospho-Silicate Glass).

The wiring 114 functions as a signal line. For example, the wiring 114 is made of a conductive material such as aluminum (Al) and aluminum-copper alloy (AlCu).

The planarizing layer 115 is intended to flatten the base region on which the organic EL device 130 is arranged, and to form a series of layers composing the organic EL device 130 with high precision. For example, the planarizing layer 115 is made of an organic insulating material such as polyimide and polybenzo oxazole or an inorganic insulating material such as silicon oxide ($SiO_2$).

The organic EL device 130 (130R, 130G, and 130B) emits the light e for image display. Specifically, the organic EL device 130 converts light of a given color (wavelength) generated in an after-mentioned layer 118 including a light emitting layer to light of three colors (R: Red, G: Green, and B: Blue) corresponding to the light's three primary colors and emits the converted light. The organic EL device 130R emits red light er, and has a structure in which a lower electrode layer 116R as a first electrode layer, the layer 118 including the light emitting layer, and an upper electrode layer 119 as a second electrode layer are layered in the order from the driving substrate 111 side. The organic EL device 130G emits green light eg, and has a structure in which a lower electrode layer 116G as a first electrode layer, the layer 118 including the light emitting layer, and the upper electrode layer 119 are layered in the order from the driving substrate 111 side. The organic EL device 130B emits blue light eb, and has a structure in which a lower electrode layer 116B as a first electrode layer, the layer 118 including the light emitting layer, and the upper electrode layer 119 are layered in the order from the driving substrate 111 side. The organic EL devices 130R, 130G, and 130B are respectively arranged correspondingly to, for example, each TFT 1121 to 1123. The lower electrode layers 116R, 116G, and 116B are connected to the wiring 114 provided for each TFT 1121 to 1123 through a connection hole (not shown) provided in the planarizing layer 115. Detailed structures of the organic EL devices 130R, 130G, and 130B will be described later (refer to FIG. 4 and FIG. 5).

The auxiliary wiring 140 is intended to decrease the resistance difference of the organic EL device 130 by modulating the resistance difference between an unshown electric power source and the upper electrode layer 119. The auxiliary wiring 140 is electrically connected to the upper electrode layer 119. The auxiliary wiring 140 is arranged on the same level layer as of the organic EL devices 130R, 130G, and 130B. For example, the auxiliary wiring 140 has a lamination structure almost similar to of the organic EL device 130R. Detailed structure of the auxiliary wiring 140 will be described later (refer to FIG. 4).

The interlayer insulating layer 117 is intended to electrically separate the organic EL devices 130R, 130G, 130B and the auxiliary wiring 140, and to determine the emission range of the light e (er, eg, and eb) emitted from each organic EL device 130R, 130G, and 130B. The interlayer insulating layer 117 is arranged around the organic EL devices 130R, 130G, and 130B and the auxiliary wiring 140 and is made of, for example, an organic insulating material such as polyimide and polybenzo oxazole, or an inorganic insulating material such as silicon oxide ($SiO_2$). The thickness thereof is about 600 nm.

The protective layer 120 is intended to protect the organic EL device 130, and is, for example, a passivation film made of a light transmissible dielectric material such as silicon oxide ($SiO_2$) and silicon nitride (SiN).

The sealing panel 150 has a structure in which a color filter 152 is provided over a sealing substrate 151.

The sealing substrate 151 is intended to support the color filter 152, and to enable the light er, eg, and eb emitted from the organic EL devices 130R, 130G, and 130B to be transmitted and emitted outside. The sealing substrate 151 is made of, for example, an insulating material such as glass.

The color filter 152 is intended to guide the light er, eg, and eb respectively emitted from the organic EL devices 130R, 130G, and 130B to outside of the display unit 101. Further, when outside light enters inside the display unit 101 and is reflected by the organic EL device 130 and the auxiliary wiring 140, the color filter secures contrast by absorbing the reflected light. The color filter 152 includes three regions arranged correspondingly to each organic EL device 130R, 130G, and 130B, that is, a red region 152R, a green region 152G, and a blue region 152B. The red region 152R, the green region 152G, and the blue region 152B are respectively made of, for example, a resin mixed with a red pigment, a green pigment, and a blue pigment.

The adhesive layer 160 is intended to bond the driving panel 110 and the sealing panel 150 together, and is made of, for example, an adhesive material such as a thermosetting resin.

In FIG. 3, in order to simplify the figure, only the three TFTs 112 (TFT 1121 to 1123) and one set of organic EL devices 130 (three organic EL devices 130R, 130G, and 130B) are shown. However, in practice, a plurality of TFTs 112 are provided in a state of matrix on the driving substrate 111, and a plurality of sets of organic EL devices 130 are arranged correspondingly to the plurality of TFTs 112.

Figure 4:
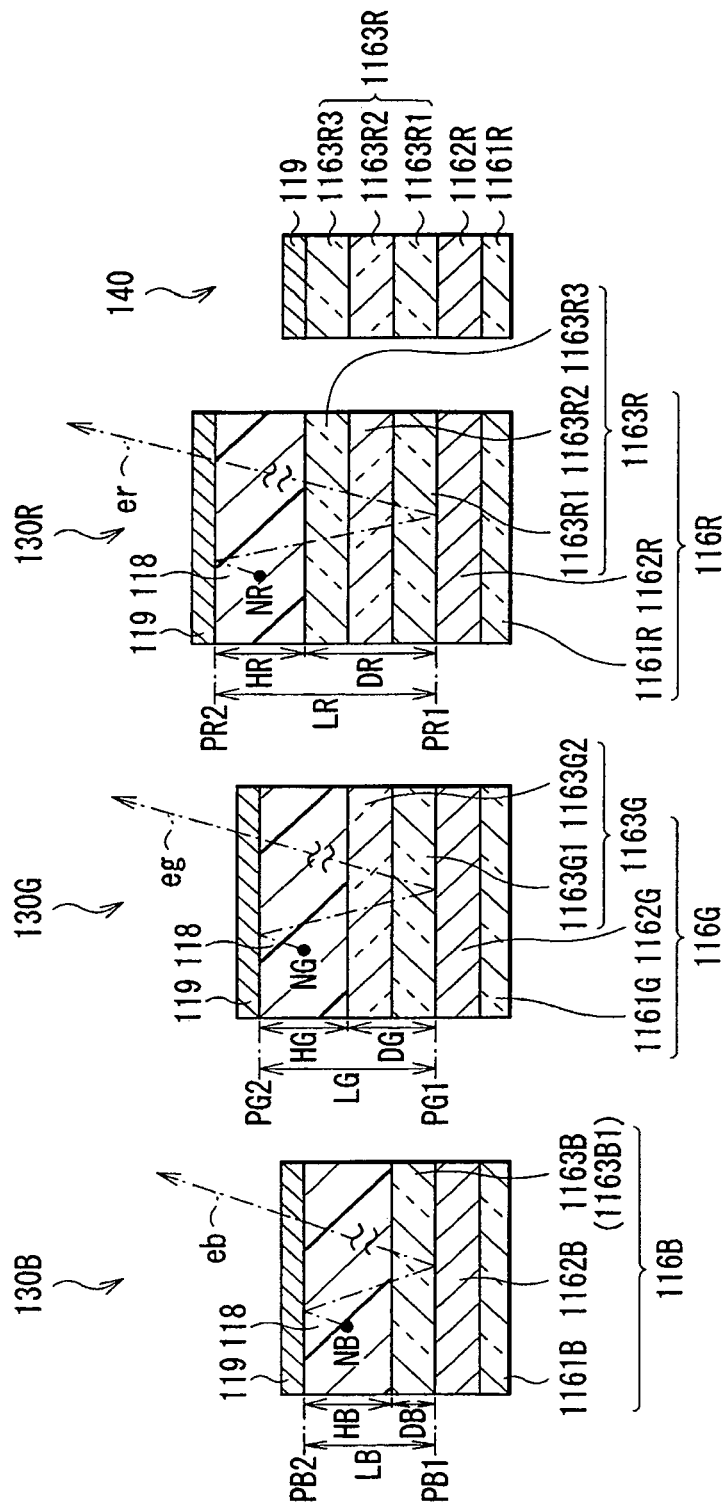
FIG. 4 is a cross section showing an enlarged model of a cross sectional structure of organic EL devices and an auxiliary wiring shown in FIG. 3.

Next, with reference to FIG. 3 and FIG. 4, detailed structures of the organic EL devices 130R, 130G, and 130B and the auxiliary wiring 140 will be described. FIG. 4 shows a model of an enlarged cross sectional structure of the organic EL devices 130R, 130G, and 130B and the auxiliary wiring 140.

The organic EL devices 130R, 130G, and 130B have a lamination structure with a total thickness different from each other, for example, as shown in FIG. 4.

The organic EL device 130B as a first organic light emitting device has a structure in which, as described above, the lower electrode layer 116B, the layer 118 including the light emitting layer, and the upper electrode layer 119 are layered in the order from the driving substrate 111 side. The lower electrode layer 116B has a structure in which a contact layer 1161B for improving contact characteristics with the driving substrate 111, more particularly with the planarizing layer 115 provided over the driving substrate 111, a resonant layer 1162B for resonating light generated in the layer 118 including the light emitting layer between the resonant layer 1162B and the upper electrode layer 119, and a barrier layer 1163B for protecting the resonant layer 1162B are layered. In particular, the barrier layer 1163B has a monolayer structure (barrier layer 1163B1). As described above, the organic EL device 130B has a resonant structure (kind of narrow band filter) for resonating light generated in the layer 118 including the light emitting layer between the resonant layer 1162B and the upper electrode layer 119. An optical distance L (LB) between the resonant layer 1162B and the upper electrode layer 119 meets the relation of the following formula (3B), for example. In particular, the organic EL device 130B converts light generated in the layer 118 including the light emitting layer to the blue light eb. More specifically, for example, in the top emission type display unit 101, the organic EL device 130B emits the light eb resonated between the resonant layer 1162B and the upper electrode layer 119 through the upper electrode layer 119.

$$(2LB)/\lambda + \varphi/(2\varphi) = mB \tag{3B}$$

In the formula, regarding LB, $\lambda$, $\varphi$, and mB, LB represents an optical distance between the resonant layer 1162B (an end face PB1 as a first end face adjacent to the barrier layer 1163B in the resonant layer 1162B) and the upper electrode layer 119 (an end face PB2 as a second end face adjacent to the layer 118 including the light emitting layer in the upper electrode layer 119); $\lambda$ represents a peak wavelength of the spectrum of light to be emitted; $\varphi$ represents a phase shift of reflected light generated on the resonant layer 1162B (end face PB1) and the upper electrode layer 119 (end face PB2); and mB represents 0 or an integer (for example, mB=0), respectively.

The contact layer 1161B is made of, for example, at least one metal from the group consisting of chromium (Cr), indium (In), tin (Sn), zinc (Zn), cadmium (Cd), titanium (Ti), aluminum (Al), magnesium (Mg), and molybdenum (Mo); an alloy of the metal; a metal oxide thereof; a metal nitride thereof or the like. The thickness thereof is about 1 nm to 300 nm. As an "alloy," a "metal oxide," and a "metal nitride," for example, indium-tin alloy (InSn), indium-zinc alloy (InZn), aluminum-neodymium alloy (AlNd), and aluminum-copper alloy silicide (AlCuSi) as an alloy; indium tin oxide (ITO) and indium zinc oxide (IZO) as a metal oxide; titanium nitride (TiN) as a metal nitride or the like can be cited. In particular, the contact layer 1161B is preferably made of, for example, ITO or IZO with superior contact characteristics and conductivity. The thickness of the contact layer 1161B is preferably about from 1 nm to 300 nm when the contact layer 1161B is made of ITO or IZO with superior conductivity, and more preferably from about 3 nm to 50 nm considering the surface flatness of ITO. Meanwhile, when the contact layer 1161B is made of chromium oxide ($Cr_2O_3$) with conductivity inferior to of ITO and IZO, the thickness of the contact layer 1161B is preferably from about 1 mm to 20 nm in order to prevent connection resistance between the wiring 114 and the lower electrode layer 116B from being excessively increased.

The resonant layer 1162B functions as a reflection layer for resonating light generated in the layer 118 including the light emitting layer between the resonant layer 1162B and the upper electrode layer 119. For example, the resonant layer 1162B is made of silver (Ag) or an alloy containing silver (Ag). As an alloy containing silver, for example, an alloy containing silver and at least one from the group consisting of palladium (Pd), neodymium (Nd), samarium (Sm), yttrium (Y), cerium (Ce), europium (Eu), gadolinium (Gd), terbium (Tb), dysprosium (Dy), erbium (Er), ytterbium (Yb), scandium (Sc), ruthenium (Ru), copper (Cu), and gold (Au), specifically silver-palladium-copper alloy (AgPdCu) or the like can be cited. The thickness of the resonant layer 1162B is thicker than the thickness of the upper electrode layer 119 in the top emission type display unit 101, and is about from 100 nm to 300 nm.

The barrier layer 1163B (1163B1) is made of, for example, a material with work function larger than of the resonant layer 1162B, and the thickness thereof is about 1 nm to 100 nm. Specifically, the barrier layer 1163B is made of, for example, a light transmissible material containing at least one metal from the group consisting of indium (In), tin (Sn), zinc (Zn), cadmium (Cd), titanium (Ti), chromium (Cr), gallium (Ga), and aluminum (Al); an alloy of the metal; a metal oxide thereof, or a metal nitride thereof. As an "alloy," a "metal oxide," and a "metal nitride," for example, indium-tin alloy and indium-zinc alloy as an alloy; ITO, IZO, indium oxide ($In_2O_3$), tin oxide ($SnO_2$), zinc oxide (ZnO), cadmium oxide (CdO), titanium oxide ($TiO_2$), and chromium oxide ($CrO_2$) as a metal oxide; titanium nitride and chromium nitride (CrN) as a metal nitride or the like can be cited.

The organic EL device 130G as a second organic light emitting device has a structure almost similar to of the organic EL device 130B, except that the structure of a barrier layer 1163G is different. That is, as described above, the organic EL device 130G has a structure in which the lower electrode layer 116G, the layer 118 including the light emitting layer, and the upper electrode layer 119 are layered in the order from the driving substrate 111 side. The lower electrode layer 116G has a structure in which a contact layer 1161G, a resonant layer 1162G, and a barrier layer 1163G are layered. In particular, the barrier layer 1163G has a two-layer structure, in which a lower barrier layer 1163G1 having a thickness similar to of the barrier layer 1163B1 and an upper barrier layer 1163G2 are layered in this order. The lower barrier layer 1163G1 and the upper barrier layer 1163G2 may be made of, for example, the same material as each other, or a material different from each other. As the organic EL device 130B, the organic EL device 130G has a resonant structure for resonating light generated in the layer 118 including the light emitting layer between the resonant layer 1162G and the upper electrode layer 119. An optical distance L (LG) between the resonant layer 1162G and the upper electrode layer 119 meets the relation of the following formula (3G), for example. In particular, the organic EL device 130G converts light generated in the layer 118 including the light emitting layer to the green light eg. More specifically, for example, in the top emission type display unit 101, the organic EL device 130G emits the light eg resonated between the resonant layer 1162G and the upper electrode layer 119 through the upper electrode layer 119.

$$(2LG)/\lambda + \varphi/(2\pi) = mG \tag{3G}$$

In the formula, regarding LG, $\varphi$, and mG, LG represents an optical distance between the resonant layer 1162G (an end face PG1 as a first end face adjacent to the barrier layer 1163G in the resonant layer 1162G) and the upper electrode layer 119 (an end face PG2 as a second end face adjacent to the layer 118 including the light emitting layer in the upper electrode layer 119); $\varphi$ represents a phase shift of reflected light generated on the resonant layer 1162G (end face PG1) and the upper electrode layer 119 (end face PG2); and mG represents 0 or an integer (for example, mG=0), respectively.

The organic EL device 130R as a third organic light emitting device has a structure almost similar to of the organic EL device 130B, except that the structure of a barrier layer 1163R is different. That is, as described above, the organic EL device 130R has a structure in which the lower electrode layer 116R, the layer 118 including the light emitting layer, and the upper electrode layer 119 are layered in the order from the driving substrate 111 side. The lower electrode layer 116R has a three-layer structure, in which a contact layer 1161R, a resonant layer 1162R, and a barrier layer 1163R are layered from the driving substrate 111 side. In particular, the barrier layer 1163R has a three-layer structure in which a lower barrier layer 1163R1 having a thickness similar to of the barrier layer 1163B1, an intermediate barrier layer 1163R2 having a thickness similar to of the lower barrier layer 1163G1, and an upper barrier layer 1163R3 are layered in this order. The lower barrier layer 1163R1, the intermediate barrier layer 1163R2, and the upper barrier layer 1163R3 may be made of, for example, the same material as each other, or a material different from each other. As the organic EL device 130B, the organic EL device 130R has a resonant structure for resonating light generated in the layer 118 including the light emitting layer between the resonant layer 1162R and the upper electrode layer 119. An optical distance L (LR) between the resonant layer 1162R and the upper electrode layer 119 meets the relation of the following formula (3R), for example. In particular, the organic EL device 130R converts light generated in the layer 118 including the light emitting layer to the red light er. More specifically, for example, in the top emission type display unit 101, the organic EL device 130R emits the light er resonated between the resonant layer 1162R and the upper electrode layer 119 through the upper electrode layer 119.

$$(2LR)/\lambda + \varphi/(2.pi.) = mR \tag{3R}$$

In the formula, regarding LR, $\varphi$, and mR, LR represents an optical distance between the resonant layer 1162R (an end face PR1 as a first end face adjacent to the barrier layer 1163R in the resonant layer 1162R) and the upper electrode layer 119 (an end face PR2 as a second end face adjacent to the layer 118 including the light emitting layer in the upper electrode layer 119); $\varphi$ represents a phase shift of reflected light generated on the resonant layer 1162R (end face PR1)

and the upper electrode layer 119 (end face PR2); and mR represents 0 or an integer (for example, mR=0), respectively.

Functions and materials of the contact layer 1161G, the resonant layer 1162G and the barrier layer 1163G (the lower barrier layer 1163G1 and the upper barrier layer 1163G2), which compose the organic EL device 130G and functions and materials of the contact layer 1161R, the resonant layer 1162R and the barrier layer 1163R (the lower barrier layer 1163R1, the intermediate barrier layer 1163R2, and the upper barrier layer 1163R3), which compose the organic EL device 130R, are respectively similar to of the contact layer 1161B, the resonant layer 1162B, and the barrier layer 1163B (1163B1), which compose the organic EL device 130B.

For confirmation, in FIG. 4, for easy finding the structural differences among the organic EL devices 130R, 130G, and 130B, both the layer 118 including the light emitting layer and the upper electrode layer 119 are shown separately for every organic EL device 130R, 130G, and 130B. However, in practice, for example, as shown in FIG. 3 and FIG. 4, the layer 118 including the light emitting layer is continuously extended thoroughly through on the lower electrode 116R (upper barrier layer 1163R3) of the organic EL device 130R, on the lower electrode layer 116G (upper barrier layer 1163G2) of the organic EL device 130G, and on the lower electrode layer 116B (barrier layer 1163B1) of the organic EL device 130B. The upper electrode layer 119 is continuously extended so that the upper electrode layer 119 covers the layer 118 including the light emitting layer. That is, both the layer 118 including the light emitting layer and the upper electrode layer 119 are shared by each organic EL device 130R, 130G, and 130B. A detailed structure of the layer 118 including the light emitting layer will be described later (refer to FIG. 5).

The upper electrode layer 119 is made of, for example, at least one metal from the group consisting of silver (Ag), aluminum (Al), magnesium (Mg), calcium (Ca), and sodium (Na), an alloy containing the metal or the like. As an "alloy containing metal," for example, magnesium-silver alloy (MgAg) or the like can be cited. In the top emission type display unit 101, the thickness of the upper electrode layer 119 is, for example, thinner than of the resonant layers 1162R, 1162G, and 1162B, and is about 1 nm to 10 nm. In particular, based on the fact that the organic EL devices 130R, 130G, and 130B have a resonant structure as described above, the upper electrode layer 119 functions as a semi-transparent reflection layer, which reflects light generated in the layer 118 including the light emitting layer in order to resonate such light between the upper electrode layer 119 and the resonant layers 1162R, 1162G, and 1162B, and which emits resonated light er, eg, and eb outside according to needs.

As shown in FIG. 4, thicknesses HR, HG, and HB of the layer 118 including the light emitting layer are equal to each other among the three organic EL devices 130R, 130G, and 130B (HR=HG=HB). The layer 118 including the light emitting layer generates light of color (wavelength) equal to each other among the three organic EL devices 130R, 130G, and 130B.

In particular, the thicknesses DR, DG, and DB of the barrier layers 1163R, 1163G, and 1163B are different from each other among the three organic EL devices 130R, 130G, and 130B, specifically different from each other correspondingly to the three light er, eg, and eb emitted from the three organic EL devices 130R, 130G, and 130B. That is, the thicknesses DR, DG, and DB are set so that the three organic EL devices 130R, 130G, and 130B can convert light generated in the layer 118 including the light emitting layer to the red light er, the green light eg, and the blue light eb and emit the converted light. Specifically, the thicknesses DR, DG, and DB are ranked in descending order corresponding to the red light er, the green light eg, and the blue light eb emitted from the three organic EL devices 130R, 130G, and 130B (DR>DG>DB). The foregoing words, "convert light generated in the layer 118 including the light emitting layer to the red light er, the green light eg, and the blue light eb and emit the converted light" means that, as shown in FIG. 4, in the process that light generated in dots NR, NG, and NB in the layer 118 including the light emitting layer is resonated between the resonant layers 1162R, 1162G, and 1162B and the upper electrode layer 119 and then emitted through the upper electrode layer 119, by utilizing light interference phenomenon resulting from the fact that resonant lengths are different among the three organic EL devices 130R, 130G, and 130B, the wavelength of light having the same wavelength as each other when light is generated in NR, NG, and NB is changed from each other for each organic EL device 130R, 130G, and 130B when light is emitted, that is, the same wavelength is respectively shifted to the wavelength corresponding to red in the organic EL device 130R, the wavelength corresponding to green in the organic EL device 130G, the wavelength corresponding to blue in the organic EL device 130B, and thereby finally the red light er, the green light eg, and the blue light eb are generated.

The auxiliary wiring 140 has a lamination structure similar to of the device with the largest total thickness among the organic EL devices 130R, 130G, and 130B, that is, similar to of the organic EL device 130R, except that, for example, as shown in FIG. 4, the auxiliary wiring 140 does not include the layer 118 including the light emitting layer in order to decrease the wiring resistance as much as possible.

Figure 5:
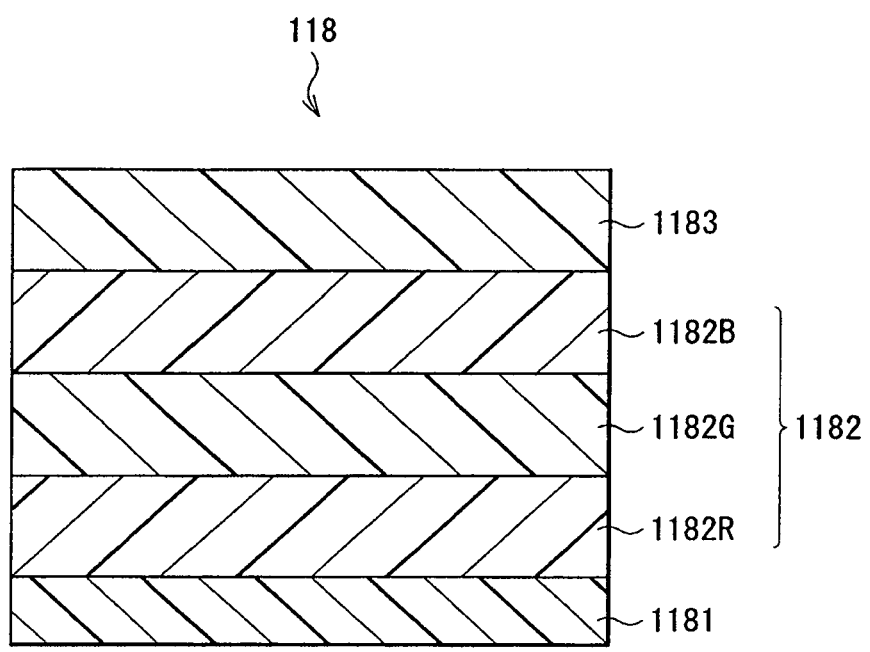
FIG. 5 is a cross section showing an enlarged model of a cross sectional structure of a layer including a light emitting layer shown in FIG. 4.

Next, with reference to FIG. 3 to FIG. 5, the detailed structure of the layer 118 including the light emitting layer will be described. FIG. 5 shows a model of an enlarged cross sectional structure of the layer 118 including the light emitting layer.

The layer 118 including the light emitting layer is, for example, as described above, shared by the organic EL devices 130R, 130G, and 130B. That is, the layer 118 including the light emitting layer has a common structure among each organic EL device 130R, 130G, and 130B, and generates white light as a given color (wavelength) light. The layer 118 including the light emitting layer has a structure, for example, as shown in FIG. 4 and FIG. 5, in which a hole transport layer 1181, a light emitting layer 1182, an electron transport layer 1183 are layered in the order from the lower electrode layers 116R, 116G, 116B side. The light emitting layer 1182 has a structure in which a red light emitting layer 1182R for emitting red light, 1182G for emitting green light, and 1182B for emitting blue light are layered from the hole transport layer 1181 side. That is, by synthesizing red light, green light, and blue light, which is respectively generated from the red light emitting layer 1182R, the green light emitting layer 1182G, and the blue light emitting layer 1182B, white light is generated as a result.

The hole transport layer 1181 is intended to improve injection efficiency of holes to be injected into the light emitting layer 1182. For example, the hole transport layer 1181 also has a function as a hole injection layer. The hole transport layer 1181 is made of, for example, an electron hole transport material such as 4,4',4"-tris(3-methyl phenyl phenyl amino)triphenylamine (m-MTDATA) and α-naphthyl phenyl diamine (αNPD), and is about 40 nm thick.

The red light emitting layer 1182R is intended to emit red light by recombining part of electron holes injected from the lower electrode layers 116R, 116G, and 116B through the hole transport layer 1181 and part of electrons injected from the upper electrode layer 119 through the electron transport layer 1183. The red light emitting layer 1182R is made of at least one from the group consisting of a red light emitting material (fluorescent or phosphorescent), an electron hole transportable material, an electron transportable material, and a both charge (electron hole and electron) transportable material, and is about 5 nm thick. As a specific material of the red light emitting layer 1182R, for example, 4-4'-bis(2, 2-diphenyl vinyl)biphenyl (DPVBi) mixed with about 30 wt % of 2,6-bis[(4'-methoxy diphenylamino)styril]-1,5-dicyano naphthalene (BSN) can be cited.

The green light emitting layer 1182G is intended to emit green light by recombining electron holes and electrons, which are not recombined in the red light emitting layer 1182R. The green light emitting layer 1182G is made of, for example, at least one from the group consisting of a green light emitting material (fluorescent or phosphorescent), an electron hole transportable material, an electron transportable material, and a both charge transportable material, and is about 10 nm thick. As a specific material of the green light emitting layer 1182G, for example, DPVBi mixed with about 5 wt % of coumarin 6 can be cited.

The blue light emitting layer 1182B emits blue light by recombining electron holes and electrons, which are not recombined in the red light emitting layer 1182R and the green light emitting layer 1182G. The blue light emitting layer 1182B is made of at least one from the group consisting of a blue light emitting material (fluorescent or phosphorescent), an electron hole transportable material, an electron transportable material, and a both charge (electron hole and electron) transportable material, and is about 30 nm thick. As a specific material of the blue light emitting layer 1182B, for example, DPVBi mixed with about 2.5 wt % of 4-41'-bis[2,{4-N,N-diphenylamino)phenyl}vinyl]biphenyl (DPAVBi) can be cited.

The electron transport layer 1183 is intended to improve injection efficiency of electrons injected into the light emitting layer 1182. For example, the electron transport layer 1183 also has a function as an electron injection layer. The electron transport layer 1183 is made of, for example, 8-hydroxy quinoline aluminum ($Alq_3$), and is about 20 nm thick.

Next, with reference to FIG. 3 to FIG. 5, operation of the display unit 101 will be described.

In the display unit 101, as shown in FIG. 3, the three organic EL devices 130R, 130G, and 130B are driven by utilizing the TFT 112 (1121 to 1123). That is, when a voltage is applied respectively between the lower electrode layers 116R, 116G, 116B and the upper electrode layer 119, as shown in FIG. 5, in the light emitting layer 1182 of the layer 118 including the light emitting layer, electron holes supplied from the hole transport layer 1181 and electrons supplied from the electron transport layer 1183 are recombined, and thereby white light is generated. The white light is synthesized light obtained by synthesizing red light generated in the red light emitting layer 1182R, green light generated in the green light emitting layer 1182G, and blue light generated in the blue light emitting layer 1182B.

As shown in FIG. 4, in the process that the light e for image display is emitted outside the display unit 101 from the organic light emitting devices 130R, 130G, and 130B, the wavelength of the white light is converted by utilizing light interference phenomenon resulting from the fact that the resonant length of each organic EL device 130R, 130G, and the 130B is different from each other, that is, the white light is converted respectively to the red light er, the green light eg, and the blue light eb in the organic EL devices 130R, 130G, and 130B. Thereby, as shown in FIG. 3, since the red light er, the green light eg, and the blue light eb are emitted respectively from the organic EL devices 130R, 130G, and 130B, images are displayed based on the three color light, er, eg, and eb.

When the light er, eg, and eb are emitted from the organic EL devices 130R, 130G, and 130B, as shown in FIG. 4, in each organic EL device 130R, 130G, and 130B, light generated in the layer 118 including the light emitting layer is resonated between the resonant layers 1162R, 1162G, 1162B of the lower electrode layers 116R, 116G, 116B and the upper electrode layer 119, and therefore the light generates multiple interference. Thereby, the half value width of the light er, eg, and eb to be finally emitted from the organic EL devices 130R, 130G, and 130B is decreased, and color purity is improved.

Next, with reference to FIG. 3 to FIG. 11, a method of manufacturing the display unit 101 shown in FIG. 3 to FIG. 5 will be described. FIG. 6 to FIG. 11 are intended to explain manufacturing steps of a main section (lower electrode layers 116R, 116G, and 116B) of the display unit 101, and each figure shows a cross sectional structure corresponding to FIG. 4. Regions SR, SG, and SB shown in FIG. 6 to FIG. 11 respectively show regions where the organic EL devices 130R, 130G, and 130B are formed in the subsequent steps.

Descriptions will be hereinafter given of the whole manufacturing steps of the display unit 101 briefly with reference to FIG. 3 to FIG. 5 first, and then of formation steps of the main section of the display unit 101, to which a method of manufacturing an organic light emitting unit according to the present invention is applied. Since the material, the thickness, and the structural characteristics of the series of components of the display unit 101 have been described in detail, the description thereof will be omitted as appropriate.

The display unit 101 can be manufactured by using an existing thin film process including deposition technique such as sputtering, patterning technique such as photolithography, and etching technique such as dry etching and wet etching. That is, when the display unit 101 is manufactured, as shown in FIG. 3, first, the plurality of TFTs 112 (TFT 1121 to 11123) are pattern-formed in a state of matrix over the driving substrate 111, and then the interlayer insulating layer 113 is formed so that the interlayer insulating layer 113 covers the TFTs 1121 to 1123 and the peripheral driving substrate 111. After that, a pair of wirings 114 is pattern-formed for every TFT 1121 to 1123. Subsequently, the planarizing layer 115 is formed so that the planarizing layer 115 covers the wiring 114 and the peripheral interlayer insulating layer 113. Thereby, the base region on which the organic EL devices 130R, 130G, and 130B will be formed in the subsequent steps is flattened. Subsequently, on the planarizing layer 115, one set of organic EL devices 130 (130R, 130G, and 130B) is pattern-formed correspondingly to the arrangement position of each TFT 1121 to 1123. Specifically, the organic EL device 130R is formed by layering the lower electrode layer 116R, the layer 118 including the light emitting layer, and the upper electrode layer 119 in this order; the organic EL device 130G is formed by layering the lower electrode layer 116G, the layer 118 including the light emitting layer, and the upper electrode layer 119 in this order; and the organic EL device 130B is formed by layering the lower electrode layer 116B, the layer 118 including the light emitting layer, and the upper electrode layer 119 in this order. When the organic EL devices 130R, 130G, and 130B are formed, for example, as shown in FIG. 3, the layer 118 including the light emitting layer and the upper electrode layer 119 are formed so that the layer 118 including the light emitting layer and the upper electrode layer 119 are continuously extended through on the lower electrode layers 116R, 116G, and 116B, and are shared by each organic EL device 130R, 130G, and 130B. In addition, as shown in FIG. 3 and FIG. 4, the contact layers 1161R, 1161G, and 1161B composing part of the lower electrode layers 116R, 116G, and 116B are formed and contacted on the driving substrate 111, more specifically on the planarizing layer 115 provided so that the planarizing layer 115 covers the driving substrate 111. Subsequently, the protective layer 120 is formed so that the protective layer 120 covers the upper electrode layer 119, and thereby the driving panel 110 is formed.

Subsequently, the color filter 152 including the red region 152R, the green region 152G, and the blue region 152B is formed correspondingly to the organic EL devices 130R, 130G, and 130B over the sealing substrate 151, and thereby the sealing panel 150 is formed.

Finally, the driving panel 110 and the sealing panel 150 are bonded together by using the adhesive layer 160 so that the organic EL devices 130R, 130G, and 130B are sandwiched between the driving substrate 111 and the sealing substrate 151, and thereby the display unit 101 is completed.

Figure 6:
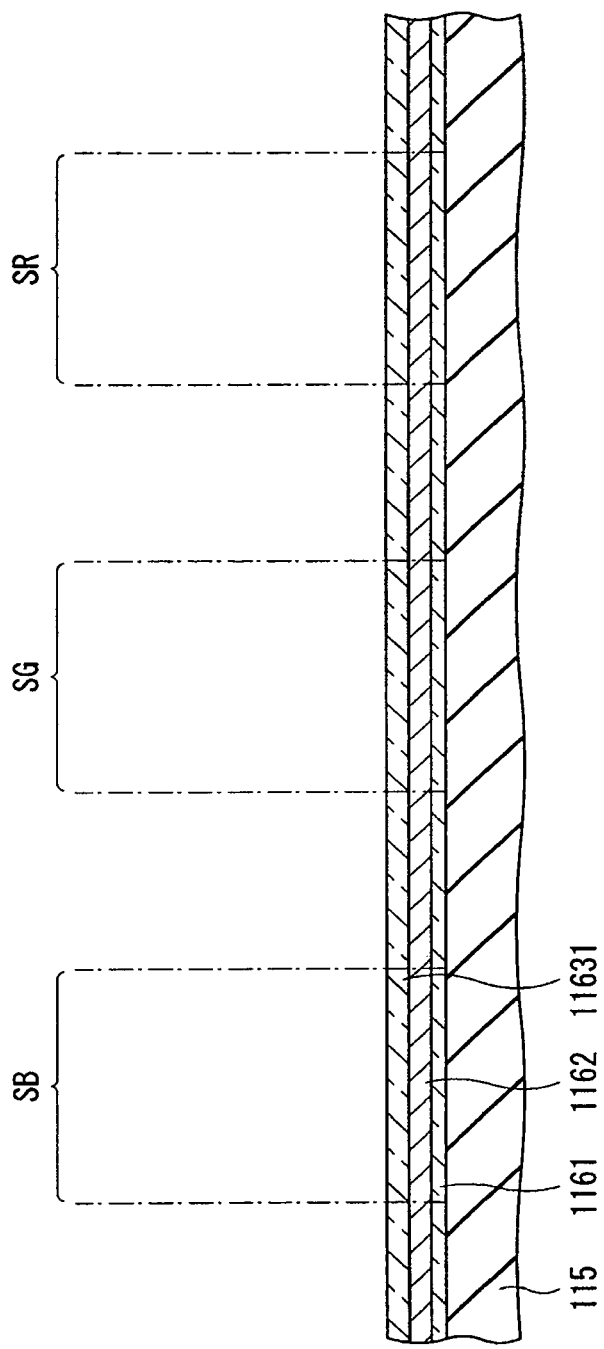
FIG. 6 is a cross section for explaining a manufacturing step of the display unit according to the second embodiment of the present invention.

When the main section of the display unit 101, the lower electrode layers 116R, 116G, and 116B are formed, first, as shown in FIG. 6, by using sputtering for example, the contact layer 1161 (thickness is about 20 mm), the resonant layer 1162 (thickness is about 100 nm), and a barrier layer portion 11631 as a first barrier layer portion (thickness is T1) are formed and layered in this order so that the driving substrate 111, which is shown in FIG. 3, more particularly the planarizing layer 115 provided on the driving substrate 111 is thereby covered. The contact layer 1161, the resonant layer 1162, and the barrier layer portion 11631 are preparation layers to finally become part of each lower electrode layer 116R, 116G, and 116B by being provided with patterning by using etching process. When the contact layer 1161 and the barrier layer portion 11631 are formed, as a formation material, the metal, the metal oxide, the metal nitride, or the metal compound, which is described above, is used, for example, ITO is used. Further, when the resonant layer 162 is formed, as a formation material, silver or the alloy containing silver, which is described above, is used, for example, silver-palladium-copper alloy (AgPdCu) is used. In this case, in particular, as described above with reference to FIG. 4, the thickness T1 of the barrier layer portion 11631 is set so that the resonant length necessary to convert white light to the blue light eb by utilizing light interference phenomenon in the organic EL device 130B can be secured based on the thickness T1.

Formation conditions of the contact layer 1161, the resonant layer 1162, and the barrier layer portion 11361 are as follows, for example. That is, as sputtering gas, mixed gas obtained by mixing 0.3% of oxygen ($O_2$) with argon (Ar) is used for forming the contact layer 1161 and the barrier layer portion 11631, and argon gas is used for forming the resonant layer 1162. Further, as sputtering conditions, in all cases, pressure=about 0.5 Pa and DC output=about 500 W are used.

Figure 7:
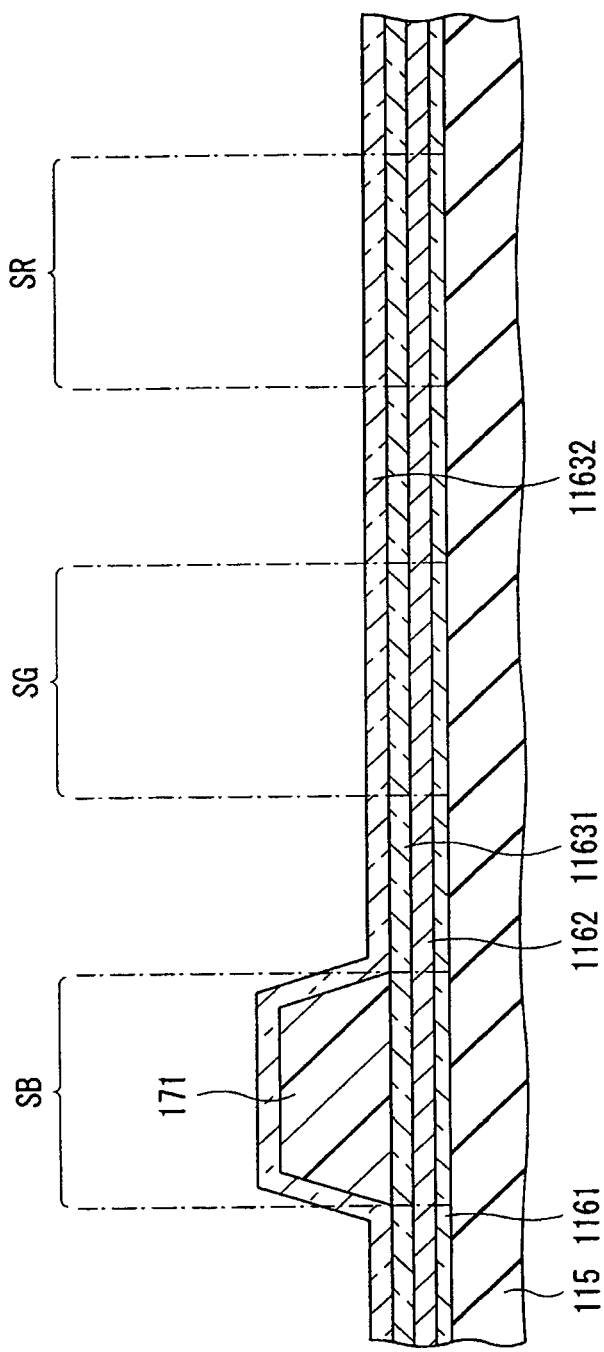
FIG. 7 is a cross section for explaining a step following FIG. 6.

Subsequently, after the barrier layer portion 11631 is coated with a photoresist to form a photoresist film (not shown), the photoresist film is provided with patterning by using photolithography process, and thereby, as shown in FIG. 7, of the barrier layer portion 11631, on a region SB as a first region where the organic EL device 130B is to be formed, an etching mask 171 as a first mask made of, for example, a photoresist film is pattern-formed.

Subsequently, as shown in FIG. 7, by using sputtering for example, a barrier layer portion 11632 (thickness is T2) as a second barrier layer portion is formed so that the barrier layer portion 11632 covers the etching mask 171 and the peripheral barrier layer portion 11631. The barrier layer portion 11632 is a preparation layer to finally become part of each lower electrode layer 116R and 116G. When the barrier layer portion 11632 is formed, as described above with reference to FIG. 4, the thickness T2 of the barrier layer portion 11632 is set so that the resonant length necessary to convert white light to the green light eg by utilizing light interference phenomenon in the organic EL device 130G can be secured based on the thickness (T1+T2). As a material of the barrier layer portion 11632, for example, a material similar to the material of the barrier layer portion 11631 is used.

Figure 8:
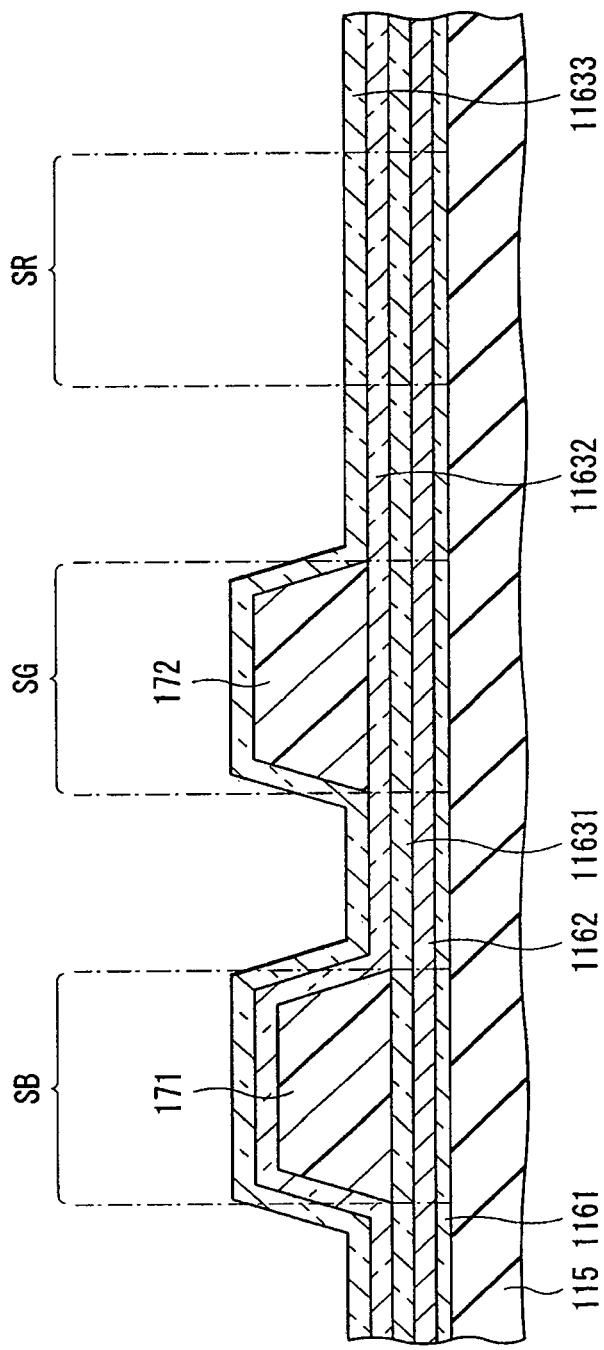
FIG. 8 is a cross section for explaining a step following FIG. 7.

Subsequently, as shown in FIG. 8, of the barrier layer portion 11632, on a region SG as a second region where the organic EL device 130G is to be formed, an etching mask 172 as a second mask made of, for example, a photoresist film is pattern-formed.

Subsequently, as shown in FIG. 8, by using sputtering for example, a barrier layer portion 11633 (thickness is T3) as a third barrier layer portion is formed so that the barrier layer portion 11633 covers the etching mask 172 and the peripheral barrier layer portion 11632. The barrier layer portion 11633 is a preparation layer to finally become part of the lower electrode layer 116R. When the barrier layer portion 11633 is formed, as described above with reference to FIG. 4, the thickness T3 of the barrier layer portion 11633 is set so that the resonant length necessary to convert white light to the red light er by utilizing light interference phenomenon in the organic EL device 130R can be secured based on the thickness (T1+T2+T3). As a material of the barrier layer portion 11633, for example, a material similar to the materials of the barrier layer portions 11631 and 11632 is used.

Figure 9:
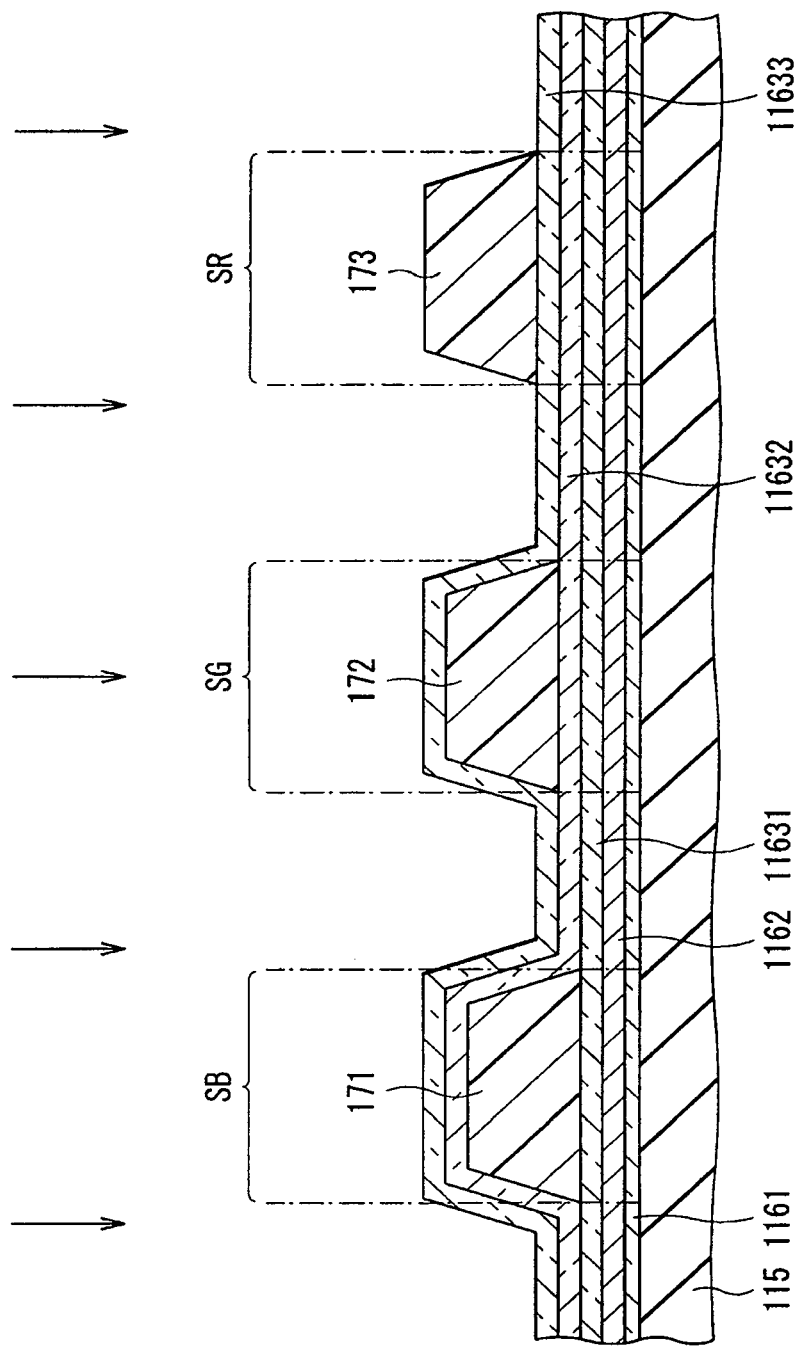
FIG. 9 is a cross section for explaining a step following FIG. 8.

Subsequently, as shown in FIG. 9, of the barrier layer portion 11633, on a region SR as a third region where the organic EL device 130R is to be formed, an etching mask 173 as a third mask made of, for example, a photoresist film is pattern-formed.

Figure 10:
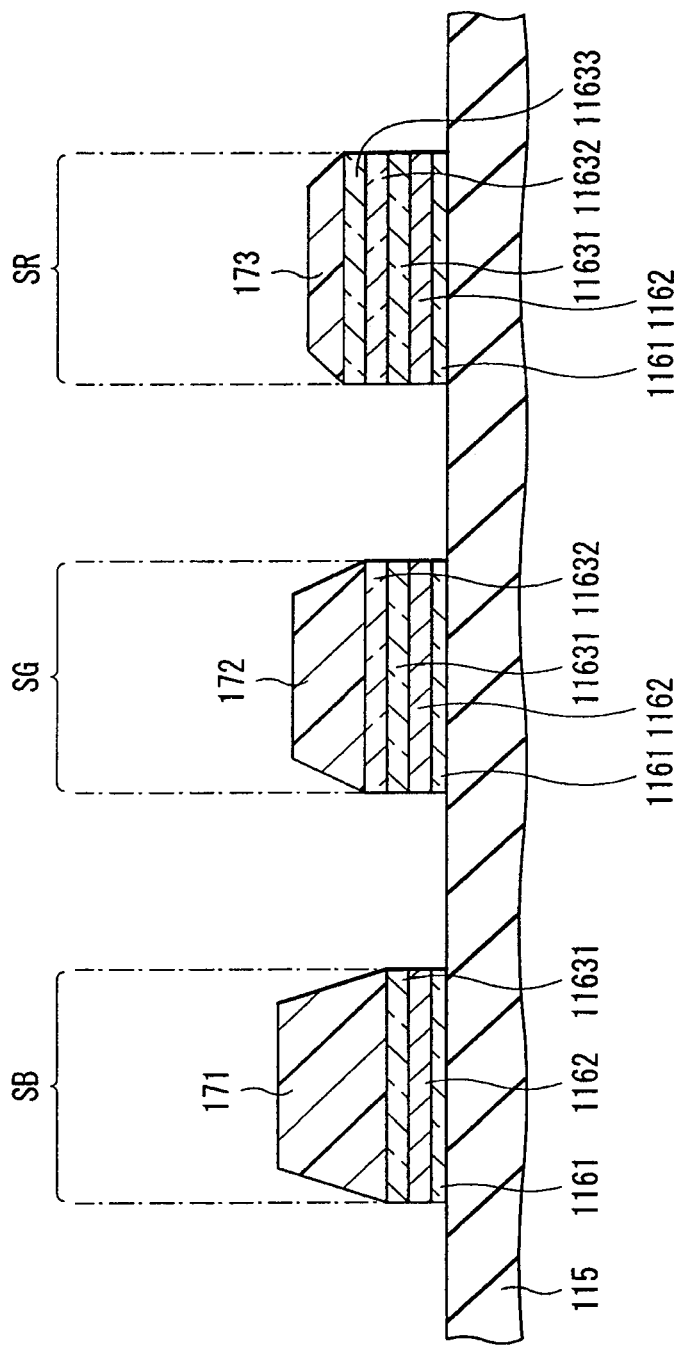
FIG. 10 is a cross section for explaining a step following FIG. 9.

Subsequently, by using a series of etching masks 171 to 173, the contact layer 1161, the resonant layer 1162, the barrier layer portions 11631 to 11633 are continuously etched and provided with patterning. Thereby, as shown in FIG. 10, of the contact layer 1161, the resonant layer 1162, the barrier layer portions 11631 to 11633, portions other than the portions covered with the etching masks 171 to 173 are selectively removed. By the etching process, the contact layer 1161, the resonant layer 1162, and the barrier layer portions 11631 to 11633 are separated according to every region, SR, SG, and SB. Specifically, in the region SB, a three-layer structure of the contact layer 1161, the resonant layer 1162, and the barrier layer portion 11631 is left; in the region SG, a four-layer structure of the contact layer 1161, the resonant layer 1162, and the barrier layer portions 11631 and 11632 is left; and in the region SR, the five-layer structure of the contact layer 1161, the resonant layer 1162, and the barrier layer portions 11631 to 11633 is left. Since the etching masks 171 to 173 themselves are etched in the etching process, the thickness of the etching masks 171 to 173 is decreased.

Figure 11:
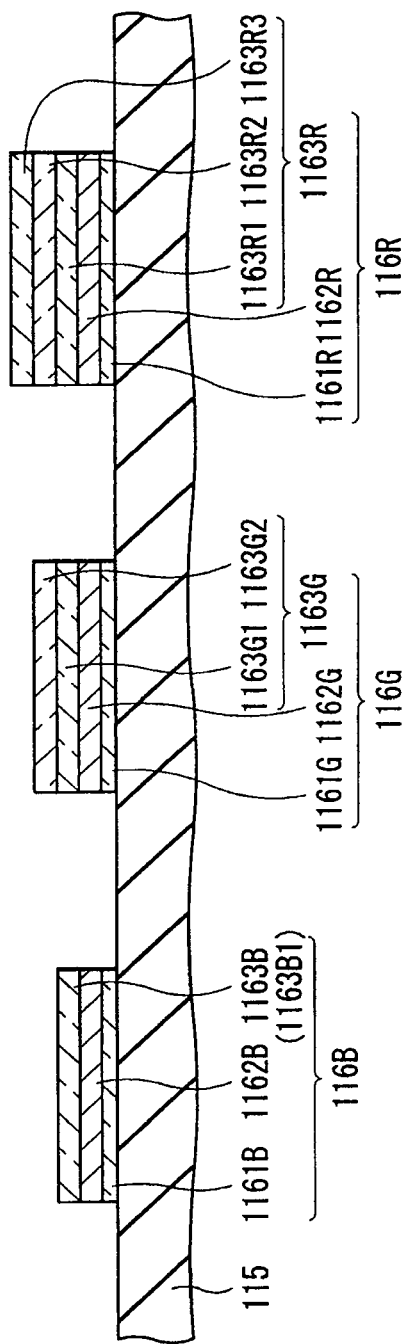
FIG. 11 is a cross section for explaining a step following FIG. 10.

Finally, by removing the etching masks 171 to 173, as shown in FIG. 11, by the remaining structures of the contact layer 1161, the resonant layer 1162, and the barrier layer portions 11631 to 11633, the lower electrode layers 116R, 116G, and 116B shown in FIG. 4 are completed. Specifically, in the region SB where the organic EL device 130B for emitting blue light eb is to be formed, the lower electrode layer 116B having a lamination structure in which the contact layer 1161B, the resonant layer 1162B, and the barrier layer 1163B (1163B1) are layered is formed, and the barrier layer 1163B is formed as a monolayer structure composed of the barrier layer portion 11631 (barrier layer 1163B1). Further, in the region SG where the organic EL device 130G for emitting green light eg is to be formed, the lower electrode layer 116G having a lamination structure in which the contact layer 1161G, the resonant layer 1162G, and the barrier layer 1163G are layered is formed, and the barrier layer 1163G is formed as a two-layer structure composed of the barrier layer portion 11631 (lower barrier layer 1163G1) and the barrier layer portion 11632 (upper barrier layer 1163 G2). Further, in the region SR where the organic EL device 130R for emitting the red light er is to be formed, the lower electrode layer 116R having a lamination structure in which the contact layer 1161R, the resonant layer 1162R, and the barrier layer 1163R are layered is formed, and the barrier layer 1163R is formed as a three-layer structure composed of the barrier layer portion 11631 (lower barrier layer 1163R1), the barrier layer portion 11632 (intermediate barrier layer 1163R2), and the barrier layer portion 11633 (upper barrier layer 1163R3).

The foregoing thicknesses T1, T2, and T3 can be freely set as long as the red light er, the green light eg, and the blue light eb can be respectively emitted in the organic EL devices 130R, 130G, and 130B finally. As an example, when the total thickness of the layer 118 including the light emitting layer is about from 40 nm to 70 nm, the thicknesses of T1, T2, and T3 are about from 2 nm to 100 nm. As a more specific example, when the total thickness of the layer 118 including the light emitting layer is about from 50 nm to 60 nm, T1 is about 2 nm to 20 nm, (T1+T2) is about from 20 nm to 50 nm, and (T1+T2+T3) is about from 50 nm to 80 nm. For reference, for example, the auxiliary wiring 140 shown in FIG. 3 can be formed in parallel through a procedure similar to the formation procedure of the organic EL device 130R.

In the display unit according to this embodiment, as shown in FIG. 3 and FIG. 4, the lower electrode layers 116R, 116G, and 116B of the organic EL devices 130R, 130G, and 130B have the structures in which the contact layers 1161R, 1161G, and 1161B; the resonant layers 1162R, 1162G, and 1162B; and the barrier layers 1163R, 1163G, and 1163B are layered from the driving substrate 111 side. The thicknesses DR, DG, and DB of the barrier layers 1163R, 1163G, and 1163B are different from each other among each organic EL device 130R, 130G, and 130B (DR>DG>DB). Therefore, for example, as described above as "operation of the display unit 101," by utilizing light interference phenomenon resulting from the difference of the resonant length among the organic EL devices 130R, 130G, and 130B based on the difference among the thicknesses DR, DG, and DB, white light generated in the layer 118 including the light emitting layer can be converted to three color light, that is, the red light er, the green light eg, and the blue light eb. Therefore, in this embodiment, images can be displayed by utilizing the three color light er, eg, and eb.

In particular, in this embodiment, based on the structural characteristics capable of constructing the foregoing display mechanism, differently from the traditional display unit described in the foregoing "BACKGROUND ART," there are advantages in both the display performance aspect and the manufacturability aspect as described below.

That is, regarding the manufacturing potency aspect, differently from the traditional display unit, in which separate coating by using a metal mask is needed when three kinds of light emitting layers are vapor-deposited due to the structural factor that the three kinds of light emitting layers capable of separately generating each color light are utilized for emitting three color (R, G, and B) light, as shown in FIG. 5, in this embodiment, one kind of light emitting layer 1182 capable of generating single color light (white light) is utilized for emitting the three color light er, eg, and eb, that is, the light emitting layer 1182 is standardized among each organic EL device 130R, 130G, and 130B, and it is not necessary to separately coat the light emitting layer 1182 by using a metal mask. Therefore, the display size is possibly jumboized.

Meanwhile, regarding the display performance aspect, differently from the traditional display unit, in which based on utilization of the light emitting layer for generating white light, only the high concentration and thick color filter for color conversion is utilized to convert the white light to three color (R, G, and B) light, in this embodiment, instead of using only the color filter for color conversion, as shown in FIG. 3 and FIG. 4, together with the color filter 152, light interference phenomenon resulting from the difference in the resonant length among the organic EL devices 130R, 130G, and 130B based on the difference among the thicknesses DR, DG, and DB as described above is used to convert white color to the three color light er, eg, and eb. Therefore, the concentration of the color filter 152 may be low and the thickness thereof may be thin. In the result, in color conversion, light utilization loss resulting from light absorption of the color filter 152 can be prevented from being increased, that is, light utilization efficiency can be secured.

Therefore, in this embodiment, since it becomes possible to obtain advantages in both the display performance aspect and the manufacturing potency aspect, securing display performance and securing manufacturing potency can be compatible with each other. In this case, in particular in the manufacturing aspect, based on the fact that separate coating of the light emitting layer 1182 using a metal mask becomes unnecessary, it becomes possible to prevent defect in the light emitting layer 1182 caused by particles mixed therein in the separate coating operation.

Further, in this embodiment, the organic EL devices 130R, 130G, and 130B respectively include the resonant layers 1162R, 1162G, and 1162B, and have the resonant structure, in which light is resonated between the resonant layers 1162R, 1162G, and 1162B and the upper electrode layer 119. Therefore, as described as "operation of the display unit 101," color purity of the light er, eg, and eb is improved. Therefore, for each light er, eg, and eb, high quality spectrum with high peak intensity and narrow wavelength width can be secured, and images with superior color reproducibility can be displayed. In this case, in particular, when the resonant layers 1162R, 1162G, and 1162B are made by using high reflective silver or an alloy containing silver, utilization efficiency of light to be resonated is improved, and therefore display performance can be more improved.

Further, in this embodiment, as described above, the barrier layers 1163R, 1163G, and 1163B carry out a function for providing the difference in the resonant length among the organic EL devices 130R, 130G, and 130B, and carry out a function for protecting the resonant layers 1162R, 1162G, and 1162B. Therefore, the resonant layers 1162R, 1162G, and 1162B are prevented from reacting with oxygen or sulfur in the atmosphere and being oxidized or corroded, or from reacting with a chemical used in the manufacturing steps of the display unit 101 and being corroded.

Further, in this embodiment, the lower electrode layers 116R, 116G, and 116B include the contact layers 1161R, 1161G, and 1161B, which are intended to improve contact characteristics with the planarizing layer 115. Therefore, the lower electrode layers 116R, 116G, and 116B can be firmly fixed to the planarizing layer 115.

Further, in this embodiment, the barrier layers 1163R, 1163G, and 1163B are made of the material with a work function larger than of the resonant layers 1162R, 1162G, and 1162B. Therefore, the injection amount of electron holes into the light emitting layer 1182 can be increased.

In the method of manufacturing a display unit according to this embodiment, for forming the lower electrode layers 116R, 116G, and 116B characterized in that the thicknesses DR, DG, and DB of the barrier layers 1163R, 1163G, and 1163B are different from each other among each organic EL device 130R, 130G, and 130B, only the existing thin film process is used, and a new and complicated manufacturing processes are not used. Furthermore, based on utilization of the existing thin film process, the lower electrode layers 116R, 116G, and 116B can be formed continuously and with good reproducibility. Therefore, in this embodiment, the display unit 101 including the lower electrode layers 116R, 116G, and 116B can be easily and stably manufactured.

Third Embodiment

Next, a third embodiment of the present invention will be described.

A display unit according to this embodiment has a structure similar to the structure (FIG. 3 to FIG. 5) of the display 101 described in the foregoing second embodiment, except that the formation steps of the lower electrode layers 116R, 116G, and 116B are different, and the display unit according to this embodiment can be manufactured by using manufacturing steps similar to the manufacturing steps of the display unit 101. In this display unit, in particular, for example, in order to precisely form the barrier layers 1163R, 1163G, and 1163B of the lower electrode layers 116R, 116G, and 116B, it is preferable that the barrier layer portion 11631 is made of tin oxide ($SnO_2$) or chromium oxide (CrO), the barrier layer portion 11632 is made of ITO, and the barrier layer portion 11633 is made of IZO.

FIG. 12 to FIG. 19 are intended to explain the manufacturing steps of the lower electrode layers 116R, 116G, and 116B of the display unit. All figures represent a cross section structure corresponding to FIG. 4. In FIG. 12 to FIG. 19, the same components as the components described in the foregoing second embodiment are affixed with the same symbols.

Figure 12:
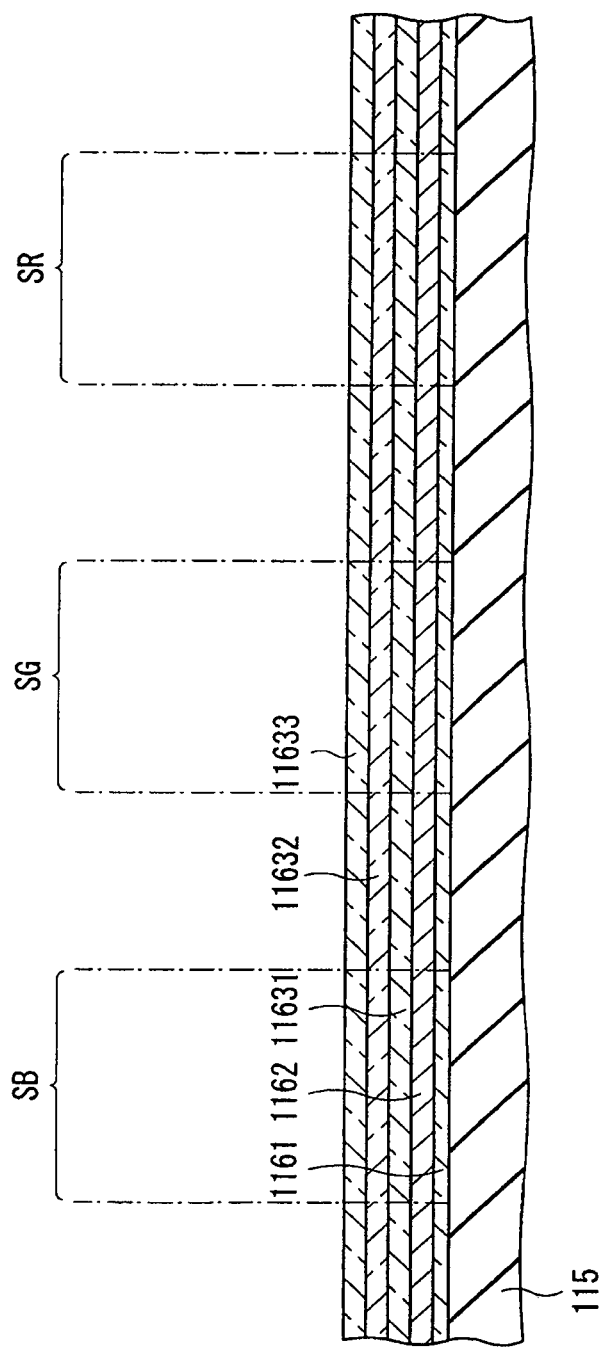
FIG. 12 is a cross section for explaining a manufacturing step of a display unit according to a third embodiment of the present invention.

When the lower electrode layers 116R, 116G, and 116B are formed, first, as shown in FIG. 12, by using sputtering for example, the contact layer 1161 (thickness is about 20 nm), the resonant layer 1162 (thickness is about 100 nm), the barrier layer portion 11631 as a first barrier layer portion (thickness is T1), a barrier layer portion 11632 as a second layer section (thickness is T2), a barrier layer portion 11633 as a third barrier layer portion (thickness is T3) are formed and layered in this order over the planarizing layer 115. As a material of the contact layer 1161 and the barrier layer portions 11631 to 11633, the metal, the metal oxide, the metal nitride, or the metal compound described in the foregoing second embodiment is used. For example, as the contact layer 1161 and the barrier layer portion 11632, ITO is used; as a barrier layer portion 11631, tin oxide ($SnO_2$) is used; and as a barrier layer portion 11633, IZO is used. Further, as a material of the resonant layer 1162, silver or the alloy containing silver, which are described in the foregoing second embodiment, is used, for example, silver-palladium-copper alloy (AgPdCu) is used. When the barrier layer portions 11631 to 11633 are formed, as described above with reference to FIG. 4, the thicknesses T1 to T3 are respectively set so that the resonant length necessary to convert white light to the red light er, the green light eg, and the blue light eb by utilizing light interference phenomenon in the organic EL devices 130R, 130G, and 130B can be secured. In particular, when the barrier layer portion 11632 made of ITO is formed, for example, in order to enable the barrier layer portion 11632 to function as a stop layer for stopping progress of etching process when the barrier layer portion 11633 made of IZO is wet-etched in the subsequent step, the barrier layer portion 11632 is deposited at high temperatures, or anealed and crystallized after the deposition. When the contact layer 1161, the resonant layer 1162, and the barrier layer portions 11631 to 11633 are formed and layered by using sputtering, for example, such series of layers are continuously formed in the same vacuum environment.

Formation conditions of the contact layer 1161, the resonant layer 1162, and the barrier layer portions 11631 to 11633 are as follows, for example. That is, as sputtering gas, mixed gas obtained by mixing 0.3% of oxygen ($O_2$) with argon (Ar) is used for forming the contact layer 1161 and the barrier layer portion 11632, argon gas is used for forming the resonant layer 1162, mixed gas obtained by mixing 0.5% of oxygen ($O_2$) with argon (Ar) is used for forming the barrier layer portion 11631, and mixed gas obtained by mixing 1.0% of oxygen ($O_2$) with argon (Ar) is used for forming the barrier layer portion 11633. Further, as sputtering conditions, in all cases, pressure=about 0.5 Pa and DC output=about 500 W are used.

Figure 13:
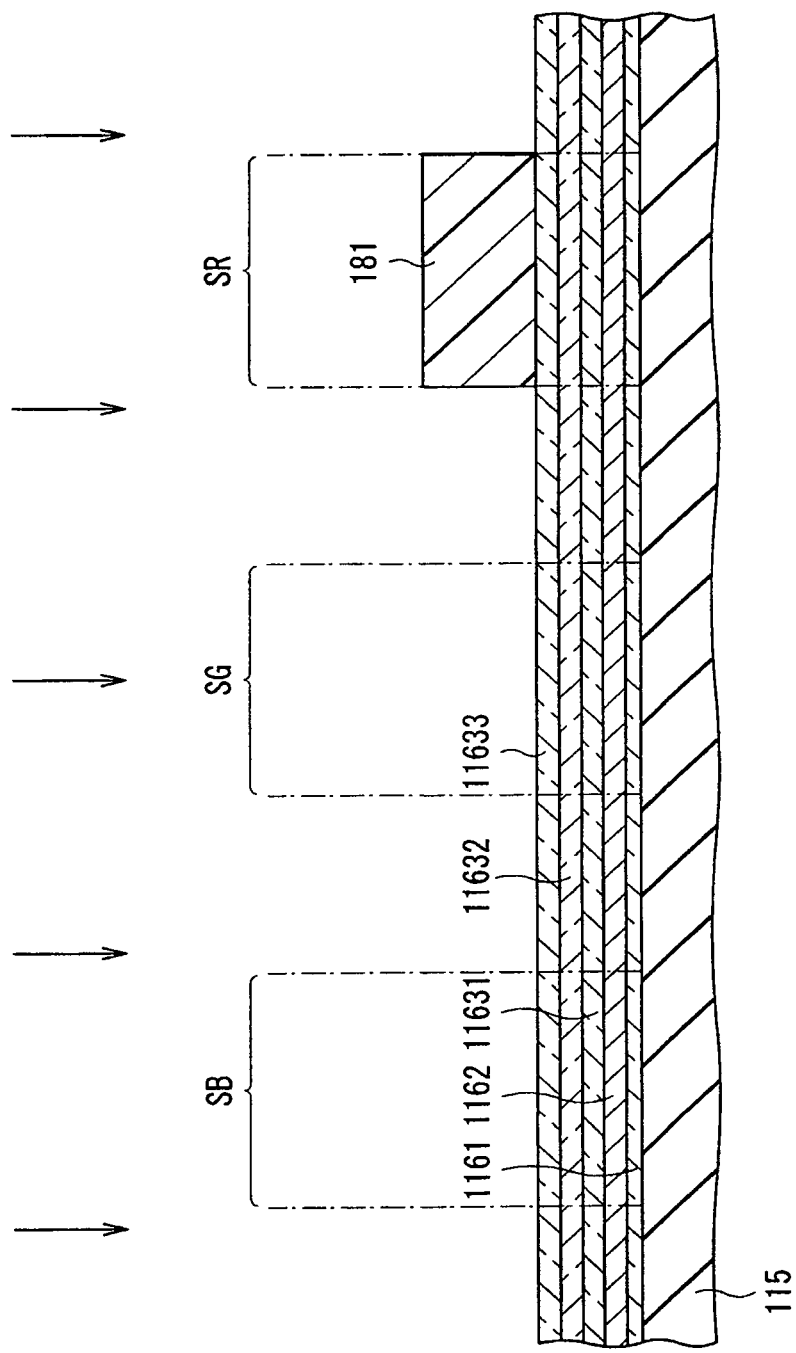
FIG. 13 is a cross section for explaining a step following FIG. 12.

Subsequently, as shown in FIG. 13, of the barrier layer portion 11633, on the region SR as a first region where the organic EL device 130R is to be formed, an etching mask 181 as a first mask made of, for example, a photoresist film is pattern-formed.

Figure 14:
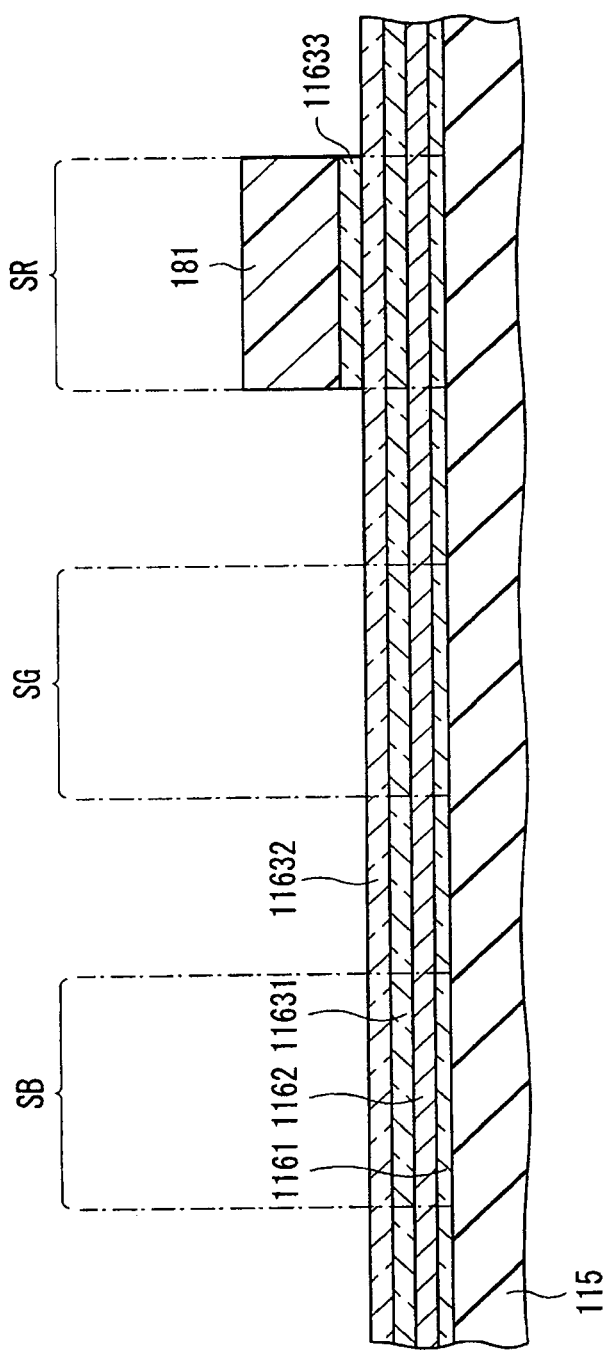
FIG. 14 is a cross section for explaining a step following FIG. 13.

Subsequently, the barrier layer portion 11633 is etched and provided with patterning by using wet etching together with the etching mask 181, and thereby as shown in FIG. 14, of the barrier layer portion 11633, the portions other than the portions covered by the etching mask 181 is selectively removed, and the barrier layer portion 11633 is left in the region SR, and the barrier layer portion 11632 is exposed in the peripheral region of the region SR. When the wet etching process is performed, as an etchant, for example, mixed acid of phosphoric acid ($H_3PO_4$), nitric acid ($HNO_3$), and acetic acid ($CH_3COOH$) or oxalic acid ($C_2H_2O_4$) is used. In the wet etching process, as described above, the barrier layer 11632 made of crystallized ITO with tolerance to the etchant functions as a stop layer, and progress of the etching process is stopped when etching of the barrier layer portion 11633 is completed. Therefore, the etching process is prevented from being performed for the barrier layer portion 11632.

Figure 15:
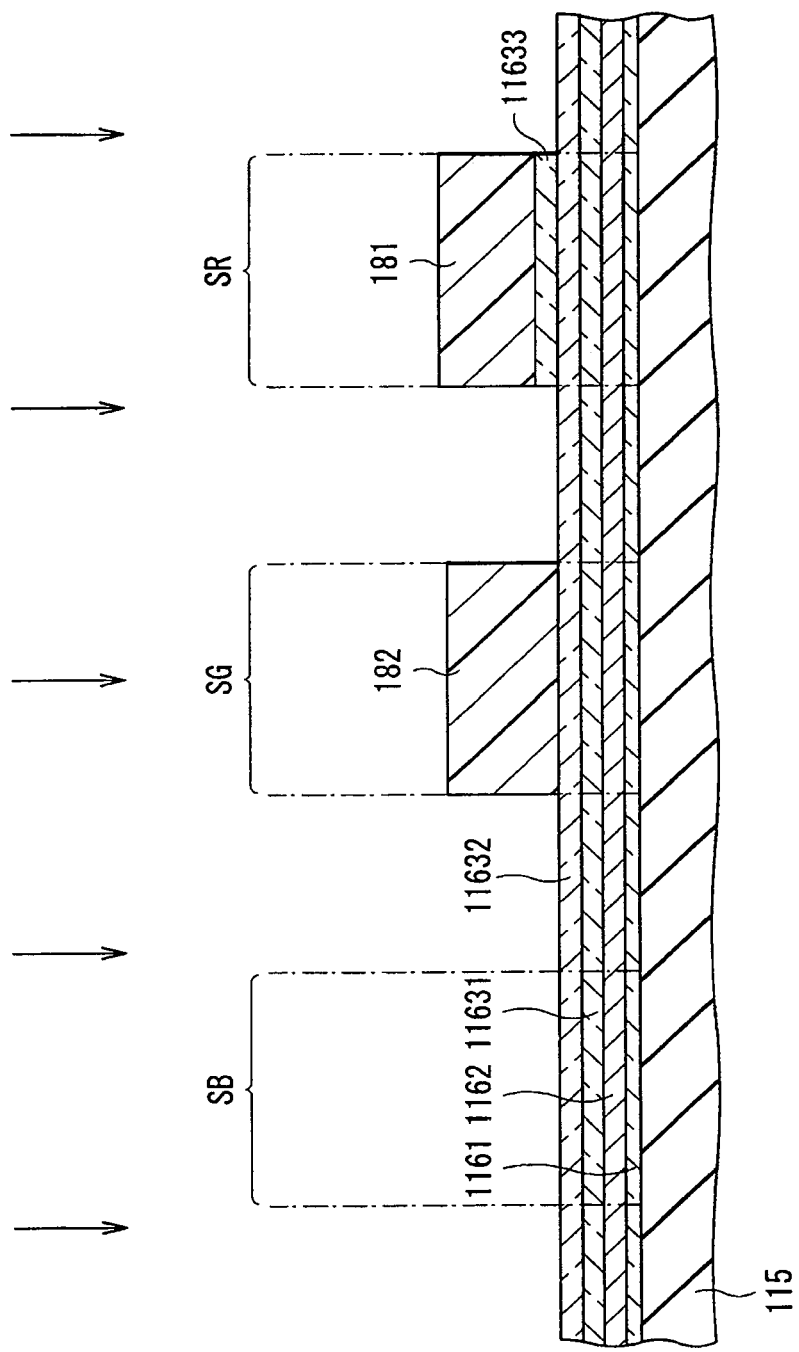
FIG. 15 is a cross section for explaining a step following FIG. 14.

Subsequently, as shown in FIG. 15, of the exposed face of the barrier layer portion 11632, on the region SG as a second region where the organic EL device 130G is to be formed, an etching mask 182 as a second mask made of, for example, a photoresist film is pattern-formed. When the etching mask 182 is formed, for example, according to needs, the used etching mask 181 is once removed before the etching mask 182 is formed, and then the etching mask 181 is newly formed again at the same time when the etching mask 182 is formed.

Figure 16:
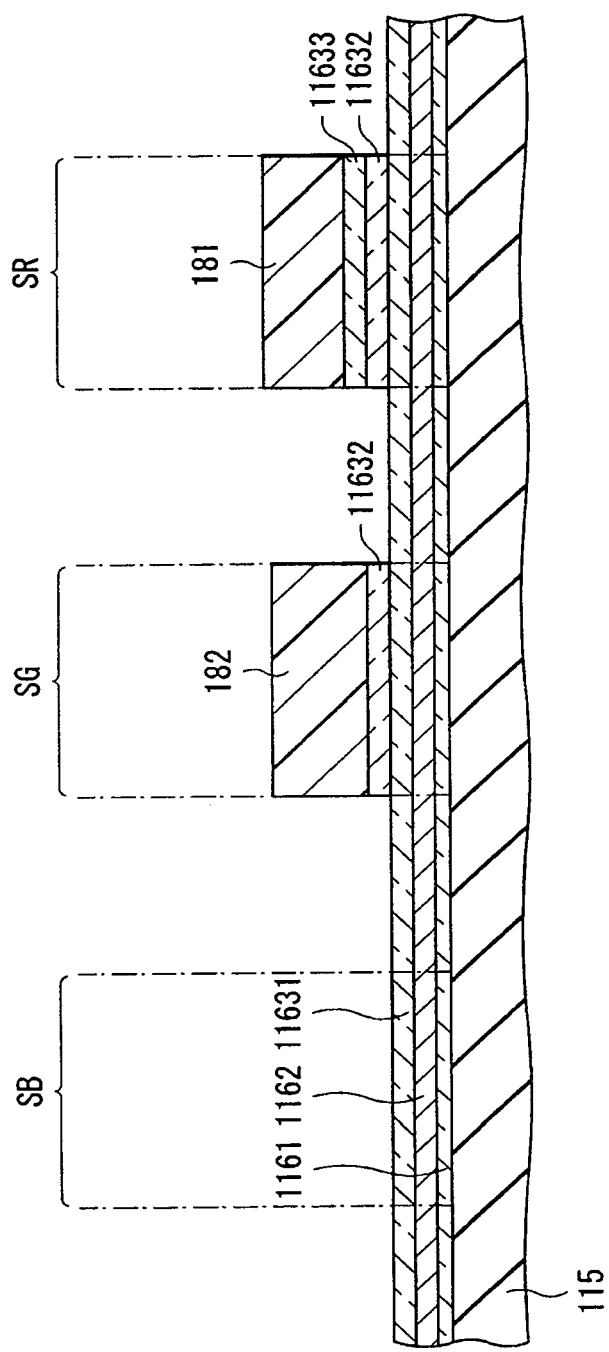
FIG. 16 is a cross section for explaining a step following FIG. 15.

Subsequently, the barrier layer portion 11632 is etched and provided with patterning by using wet etching together with the etching masks 181 and 182, and thereby as shown in FIG. 16, of the barrier layer portion 11632, the sections other than the sections covered by the etching masks 181 and 182 are selectively removed, and the barrier layer portion 11632 is left in the regions SR and SG, and the barrier layer portion 11631 is exposed in the peripheral region of the regions SR and SG. When the wet etching process is performed, as an etchant, for example, hydrochloric acid (HCl), acid containing hydrochloric acid, mixed acid of hydrofluoric acid and nitric acid is used. In the wet etching process, as in the foregoing barrier layer portion 11632, the barrier layer 11631 made of tin oxide with tolerance to the etchant functions as a stop layer, and progress of the etching process is stopped when etching of the barrier layer portion 11632 is completed. Therefore, the etching process is prevented from being performed for the barrier layer portion 11631.

Figure 17:
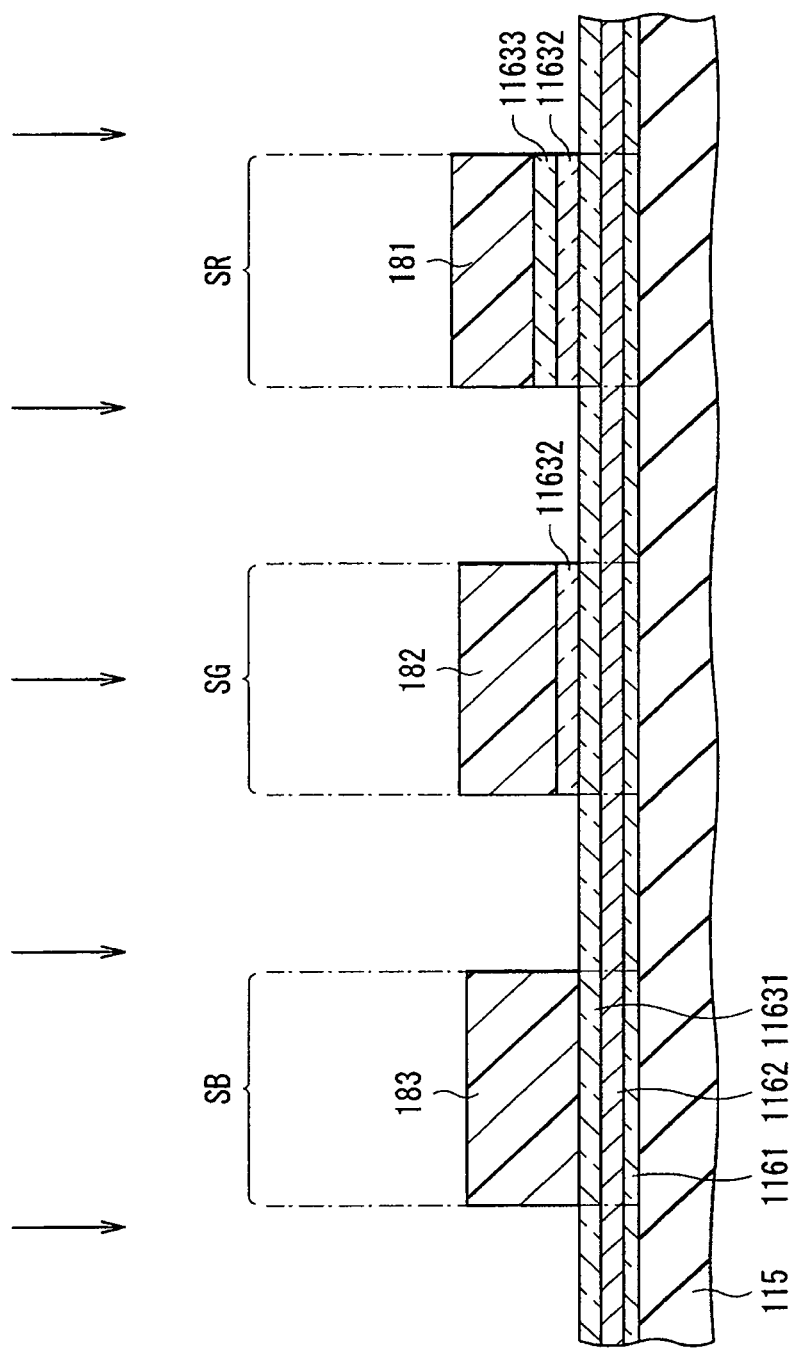
FIG. 17 is a cross section for explaining a step following FIG. 16.

Subsequently, as shown in FIG. 17, of the exposed face of the barrier layer portion 11631, on the region SB as a third region where the organic EL device 130B is to be formed, an etching mask 183 as a third mask made of, for example, a photoresist film is pattern-formed. When the etching mask 183 is formed, for example, according to needs, the used etching masks 181 and 182 are once removed before the etching mask 183 is formed, and then the etching masks 181 and 182 are newly formed again at the same time when the etching mask 183 is formed.

Figure 18:
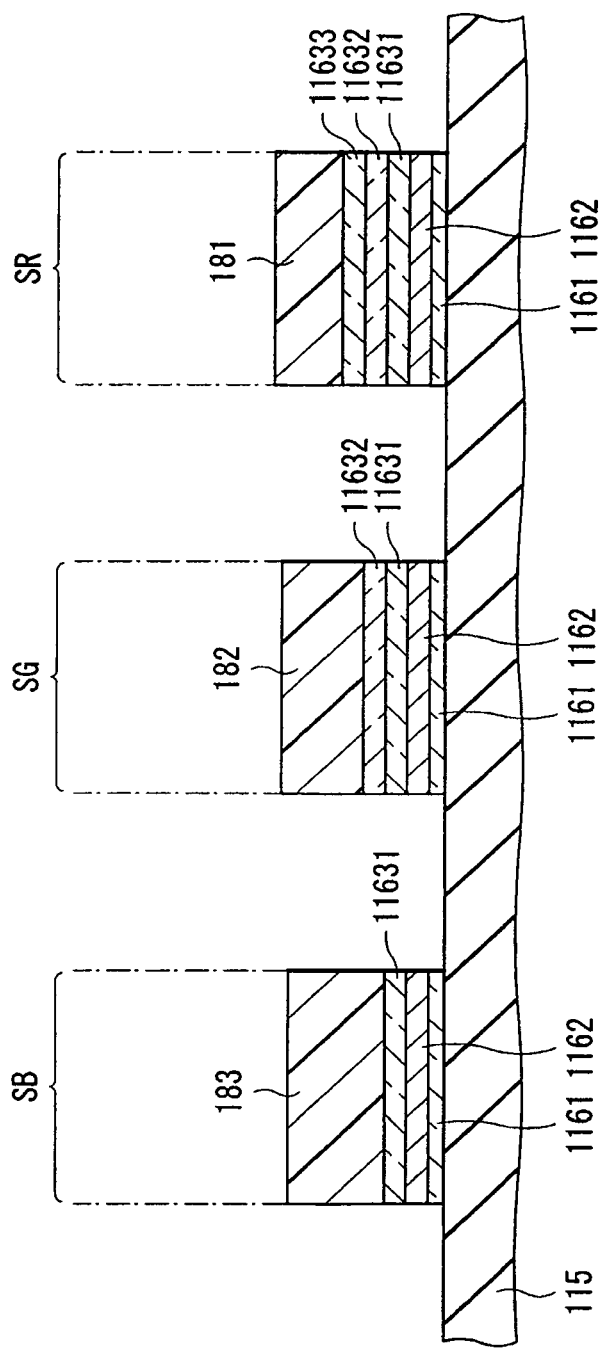
FIG. 18 is a cross section for explaining a step following FIG. 17.

Subsequently, by using dry etching together with the etching masks 181 to 183, the contact layer 1161, the resonant layer 1162, and the barrier layer portion 11631 are continuously etched and provided with patterning. Thereby, as shown in FIG. 18, of the contact layer 1161, the resonant layer 1162, and the barrier layer portion 11631, portions other than the portions covered by the etching masks 181 to 183 are selectively removed. By the etching process, the contact layer 1161, the resonant layer 1162, and the barrier layer portion 11631 are separated for every region, SR, SG, and SB. Specifically, in the region SR, the five-layer structure of the contact layer 1161, the resonant layer 1162, and the barrier layer portions 11631 to 11633 is left; in the region SG, a four-layer structure of the contact layer 1161, the resonant layer 1162, and the barrier layer portions 11631 and 11632 is left; and in the region SB, a three-layer structure of the contact layer 1161, the resonant layer 1162, and the barrier layer portion 11631 is left. Since the etching masks 181 to 183 themselves are etched in the etching process, the thickness of the etching masks 181 to 183 is decreased.

Figure 19:
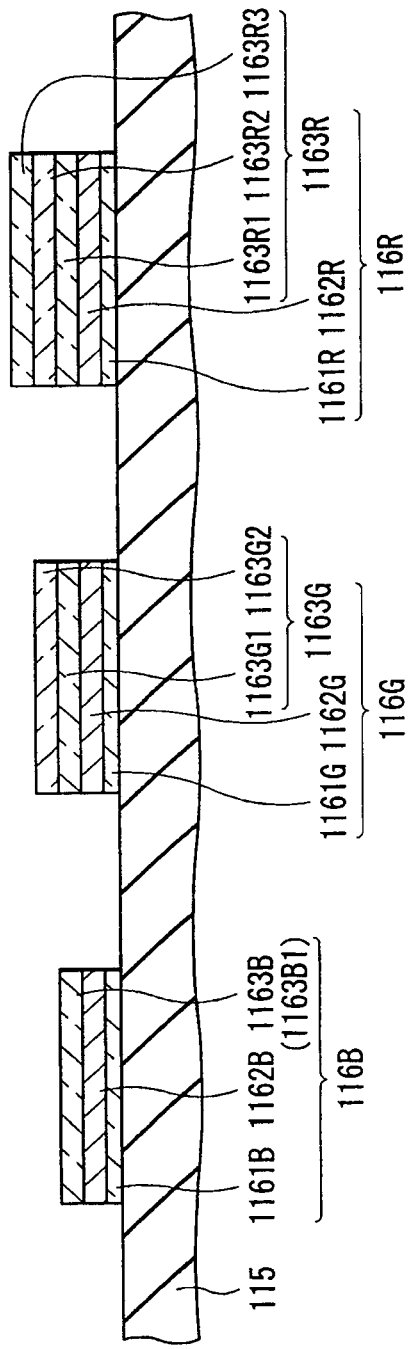
FIG. 19 is a cross section for explaining a step following FIG. 18.

Finally, by removing the etching masks 181 to 183, as shown in FIG. 19, by the foregoing remaining structures of the contact layer 1161, the resonant layer 1162, and the barrier layer portions 11631 to 11633, the lower electrode layers 116R, 116G, and 116B shown in FIG. 4 are completed as in the case shown in FIG. 11 in the foregoing second embodiment.

In the method of manufacturing a display unit according to this embodiment, the lower electrode layers 116R, 116G, and 116B can be continuously formed with favorable reproducibility by using only the existing thin film process. Therefore, as in the second embodiment, the display unit 101 can be manufactured easily and stably.

In particular, in this embodiment, the barrier layer portions 11631 to 11633 are formed by using the material having tolerance to the etchant different from each other. Specifically the barrier layer portion 11632 is formed by using the material having tolerance to the etchant for wet-etching the barrier layer portion 11633, and similarly the barrier layer portion 11631 is formed by using the material having tolerance to the etchant for wet-etching the barrier layer portion 11632. Therefore, the barrier layer portion 11632 functions as a stop layer to stop etching process when the barrier layer portion 11633 is etched. Similarly, the barrier layer portion 11631 functions as a stop layer when the barrier layer portion 11632 is etched. Therefore, the etching process is prevented from being performed for the sections for which etching process is not necessary, and therefore the lower electrode layers 116R, 116G, and 116B can be high-precisely formed.

Further, in this embodiment, when the contact layer 1161, the resonant layer 1162, and the barrier layer portions 11631 to 11633 are formed and layered by sputtering, the series of layers is continuously formed in the same vacuum environment. Therefore, differently from the case that the series of layers is formed through a plurality of vacuum environments, that is, vacuum environment and atmospheric environment, foreign objects in the atmospheric environment is prevented from being mixed between each layer, and the interface of each layer can be maintained clean.

Operation, action, and effect of the display unit of the present invention are similar to of the foregoing second embodiment.

In the second and the third embodiments, as shown in FIG. 5, in order to emit white light in the light emitting layer 1182, the light emitting layer 1182 is structured as the three-layer structure, in which the red light emitting layer 1182R, the green light emitting layer 1182G, and the blue light emitting layer 1182B are layered. However, the structure of the light emitting layer 1182 is not limited thereto, and may be freely changed as long as the white light can be emitted. As a structure of the light emitting layer 1182 other than the foregoing three-layer structure, for example, (1) a monolayer structure using a white light emitting material capable of emitting white light, (2) a monolayer structure using a mixed material, in which a red light emitting material, a green light emitting material, and a blue light emitting material are mixed, (3) a two-layer structure, in which a mixed light emitting layer made of a mixed material of a red light emitting material and a green light emitting material and other mixed light emitting layer made of a mixed material of a green light emitting material and a blue light emitting material are layered and the like can be used. In the foregoing all cases, effects similar to of the second and third embodiments can be obtained.

Further, in the foregoing second and the third embodiments, white light is generated in the light emitting layer 1182. However, color of light generated in the light emitting layer 1182 is not limited thereto, and may be freely changed, for example, as long as light generated in the light emitting layer 1182 can be converted to the three color light er, eg, and eb by utilizing the difference in the resonant length among each organic EL device 130R, 130G, and 130B. In this case, effects similar to of the foregoing second and the third embodiments can be obtained.

Further, in the second and the third embodiments, the case in which the thicknesses DR, DG, and DB of the barrier layers 1163R, 1163G, and 1163B, which compose each organic EL device 130R, 130G, and 130B, are in relation of DR>DG>DB has been described. However, the relation among the thicknesses DR, DG, and DB is not necessarily limited thereto. As long as effects similar to of the foregoing second and third embodiments can be obtained, the relation among the thicknesses DR, DG, and DB can be freely changed. In this regard, more specifically, the relation of DR>DG>DB described in the foregoing second and third embodiments is effected when the relation of mR=mG=mB (for example, mR=mG=mB=0) is effected among mR, mG, and mB in the series of formulas (3B) to (3R). Therefore, according to setting of the values of mR, mG, and mB, the relation among the thicknesses DR, DG, and DB may be changed. As an example, when the relation of mR (mG)≠mB (for example, mR=mG=0, and mB=1) is effected among mR, mG, and mB, the relation of DB>DR>DG is effected among the thicknesses DR, DG, and DB. In this case, in particular, the thickness of the thickest barrier layer 1163B is about 100 nm or more.

Figure 20:
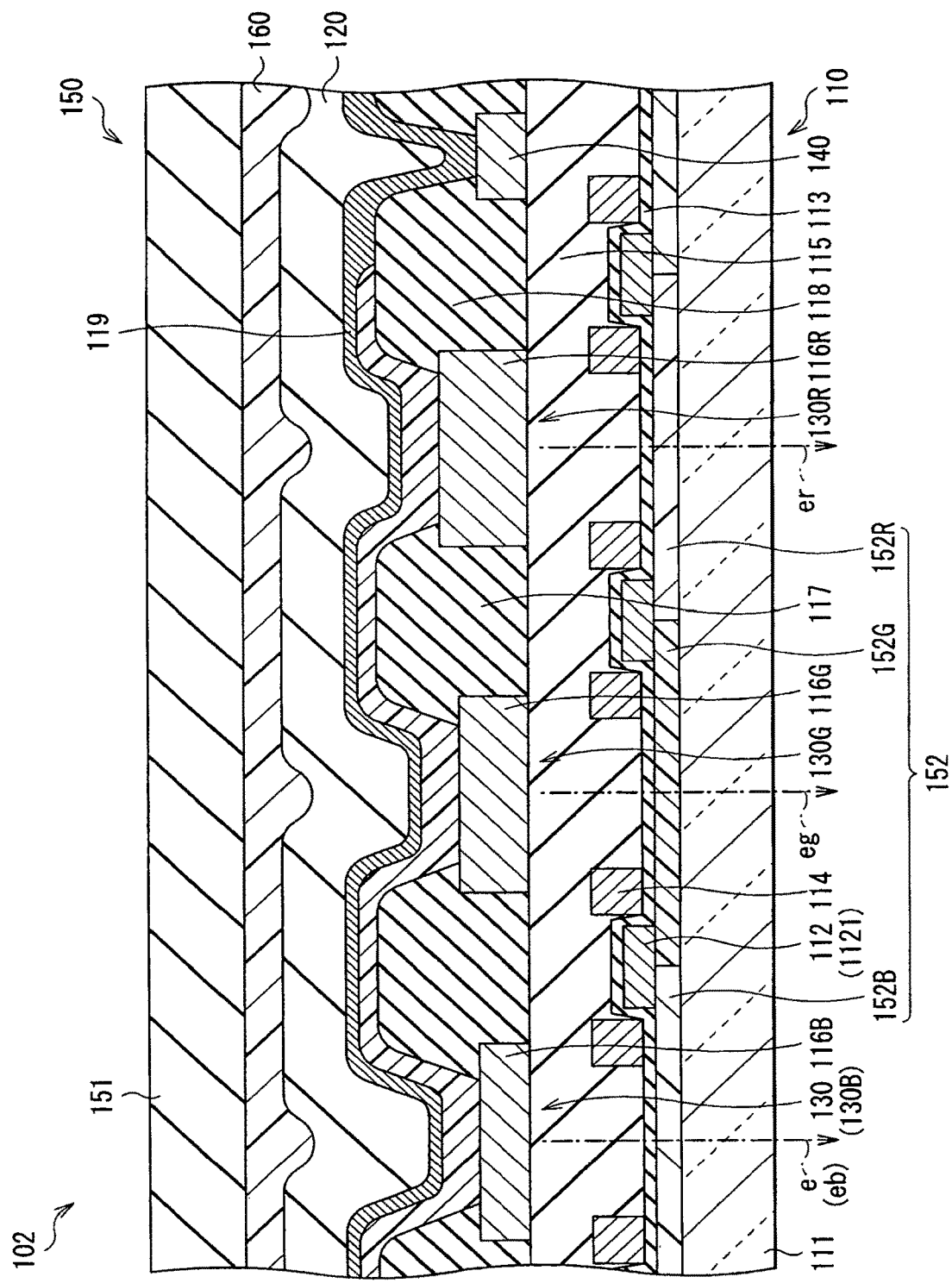
FIG. 20 is a cross section showing another cross sectional configuration of the display unit according to the second and the third embodiments of the present invention.
Figure 21:
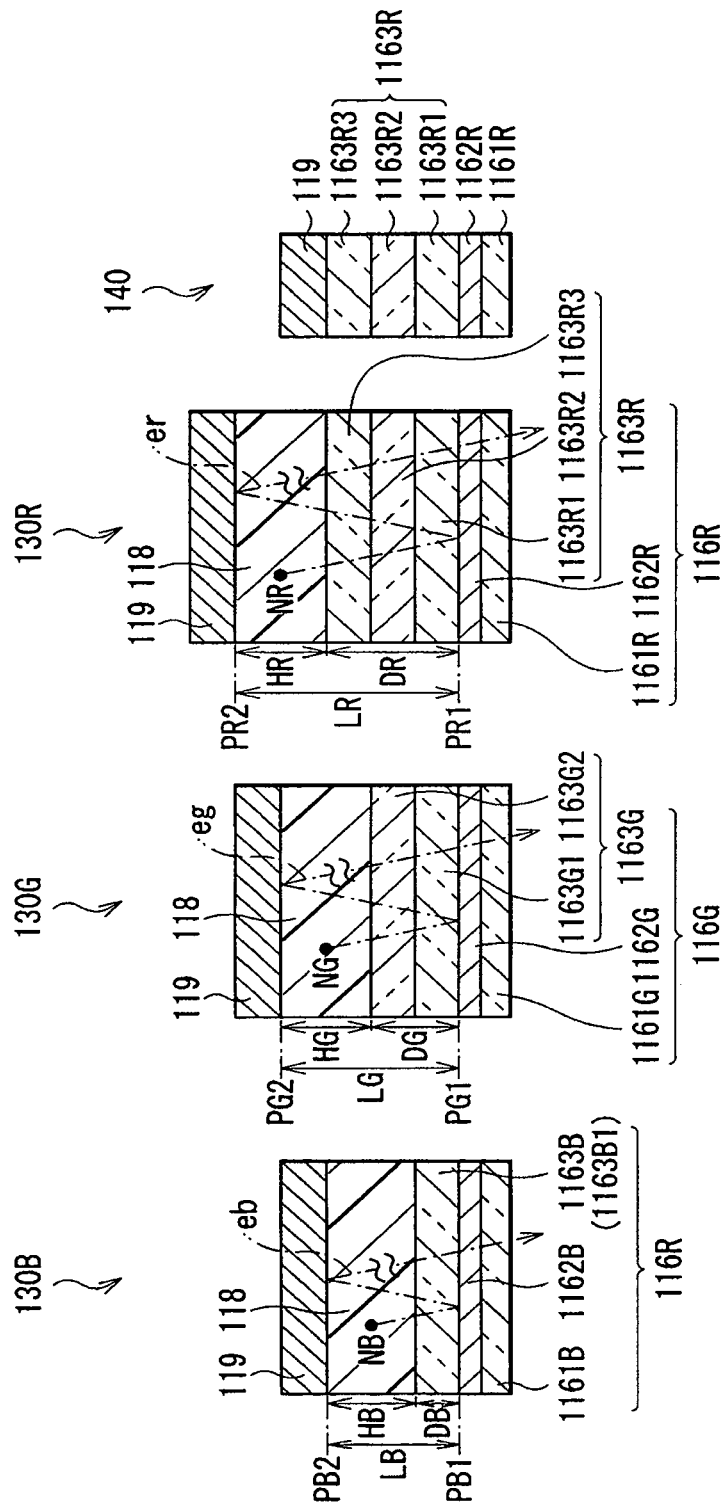
FIG. 21 is a cross section showing an enlarged model of a cross sectional structure of organic EL devices and an auxiliary wiring shown in FIG. 20.

In the foregoing second and third embodiments, as shown in FIG. 3 and FIG. 4, the case in which the present invention is applied to the top emission type display unit has been described. However, applicable type is not limited thereto, but for example, as shown in FIG. 20 and FIG. 21, the present invention may be applied to a bottom emission type display unit. FIG. 20 shows a cross sectional configuration of a bottom emission type display unit 102. FIG. 21 shows a model of a cross sectional structure of the organic EL devices 130R, 130G, and 130B and the auxiliary wiring 140, which compose the display unit 102 shown in FIG. 20. The display unit 102 has a configuration almost similar to of the top emission type display unit 101 shown in FIG. 3, except that as shown in FIG. 20 mainly, (1) the TFT 112 (1121 to 1123) is arranged not correspondingly to the arrangement position of the organic EL device 130 (130R, 130G, and 130B) but arranged so that the TFT 112 is shifted from the position corresponding to the organic EL device 130, (2) the color filter 152 is arranged between the driving substrate 111 and the TFT 112, the interlayer insulating layer 113, and (3) as shown in FIG. 21, the thicknesses of the resonant layers 1162R, 1162G, and 1162B are thinner than the thickness of the upper electrode layer 119. In the display unit 102, the organic EL devices 130R, 130G, and 130B emit light er, eg, and eb resonated between the resonant layers 1162R, 1162G, and 1162B and the upper electrode layer 119 through the lower electrode layers 116R, 116G, and 116B. The thicknesses of the resonant layers 1162R, 1162G, and 1162B in this case are about from 1 nm to 50 nm, and the thickness of the upper electrode layer 119 is about from 100 nm to 300 nm. In the bottom emission type display unit 102, for example, instead that the protective layer 120, the adhesive layer 160, and the sealing panel 150 (sealing substrate 151) are included as shown in FIG. 20, in some cases a hollow sealing cap containing deoxidizer may be included. In the bottom emission type display unit 102, effects similar to of the top emission type display unit 101 described in the second and the third embodiments can be also obtained.

Further, in the foregoing second and third embodiments, the case in which the organic light emitting unit of the present invention is applied to the organic EL display as a display unit has been described. However, the application is not limited thereto, and for example, the organic light emitting unit of the present invention may be applied to a display unit other than the organic EL display. Needless to say, the organic light emitting unit of the present invention can be applied to equipment other than display units, for example. As "equipment other than display units," for example, a lighting system or the like can be cited. In such a case, effects similar to of each embodiment described above can be obtained.

Next, manufacturing procedures of display units of specific examples of the present invention and comparative examples relative to the examples will be described, and then evaluation results thereof will be described.

EXAMPLE 1

In Example 1, the top emission type display unit 1 for performing full color display, which has been described with reference to FIG. 1, was fabricated as follows.

First, on the substrate 2 made of a glass plate, the lower electrode 4 made of chromium (film thickness as about 100 nm) as an anode becoming a mirror, and the transparent conductive layers 5B, 5G, and 5R made of ITO with each film thickness were pattern-formed. Next, a cell for organic EL device, in which regions other than light emitting regions of 2 mm×2 mm in the surface central portions of the transparent conductive layers 5B, 5G, and 5R were masked by an insulating film (not shown) was fabricated. Next, a metal mask having an aperture over the exposed portions of the transparent conductive layers 5B, 5G, and 5R becoming each light emitting region was arranged over the substrate 2 in proximity thereto, and the function layer 6 of the organic EL device having the light emitting spectrum through blue, green, and red was formed on the transparent conductive layers 5B, 5G, and 5R and the insulating film by vacuum vapor deposition method under vacuum of $10^{-4}$ Pa or less. After that, as a cathode becoming a half mirror, the upper electrode 7 was formed by depositing a thin film being 12 nm thick at a co-deposition ratio of Mg:Ag=10:1, and further depositing ITO being 150 nm thick so that the reflectance was in the range from 0.1% to less than 50%. Thereby, the display unit 1 of Example 1 was obtained. The reflectance of the cathode as a half mirror was 45% with respect to light with wavelength of 550 nm.

In the display unit of Example 1, the optical distance L, which was the minimum value among the optical distances L of the oscillation section meeting the foregoing formula (1) was set so that extraction of light (blue: wavelength λ=460 nm, green: wavelength λ=530 nm, and red: wavelength λ=630 nm) extracted from each organic EL device 3B, 3G, and 3R became the maximum. That is, the optical distance Lt and Lf in the foregoing formula (2) were set so that the value of m in the formula (1) became m (blue)=0, m (green)=0, and m (red)=0. In this case, the film thickness of the function layer 6 was 73 nm, and the optical distance Lt of each transparent conductive layer 5B, 5G, and 5R was set to Lt (blue)=10 nm, Lt (green)=41 nm, and Lt (red)=75 nm so that the formula (2) was met.

EXAMPLE 2

The display unit 1 was fabricated as in Example 1, except that the optical distances Lt and Lf were set so that the value of m became m (blue)=1, m (green)=0, and m (red)=0, that is, the film thickness of the function layer 6 was 80 nm, the film thickness of the cathode was 9 nm, and the optical distance Lt was Lt (blue)=110 nm, Lt (green)=10 nm, and Lt (red)=44 nm. The reflectance of the cathode in this case was 30% with respect to light with wavelength of 550 nm.

EXAMPLE 3

The display unit 1 was fabricated as in Example 1, except that the optical distances Lt and Lf were set so that the value of m became m (blue)=1, m (green)=1, and m (red)=0, that is, the film thickness of the function layer 6 was 105 nm, the film thickness of the cathode was 6 nm, and the optical distance Lt was Lt (blue)=85 nm, Lt (green)=135 nm, and Lt (red)=10 nm. The reflectance of the cathode in this case was 15% with respect to light with wavelength of 550 nm.

EXAMPLE 4

The display unit 1 was fabricated as in Example 1, except that the optical distances Lt and Lf were set so that the value of m became m (blue)=1, m (green)=1, and m (red)=1, that is, the film thickness of the function layer 6 was 175 nm, the film thickness of the cathode was 6 nm, and the optical distance Lt was Lt (blue)=10 nm, Lt (green)=65 nm, and Lt (red)=130 nm. The reflectance of the cathode in this case was 15% with respect to light with wavelength of 550 nm.

EXAMPLE 5

The display unit 1 was fabricated as in Example 1, except that the optical distances Lt and Lf were set so that the value of m became m (blue)=2, m (green)=1, and m (red)=1, that is, the film thickness of the function layer 6 was 240 nm, the film thickness of the cathode was 6 nm, and the optical distance Lt was Lt (blue)=95 nm, Lt (green)=10 nm, and Lt (red)=70 nm. The reflectance of the cathode in this case was 15% with respect to light with wavelength of 550 nm.

COMPARATIVE EXAMPLE 1

In Comparative example 1, a bottom emission type display unit, in which organic EL devices in which the same function layer as of Example 1 was used and multiple interference by light resonator structure was not used were arranged was fabricated as follows.

First, on a substrate 2 made of a glass plate, as a lower electrode becoming an anode, ITO (film thickness was about 180 nm), which was a transparent conductive material was pattern-formed. Next, a cell for organic EL device, in which regions other than light emitting regions of 2 mm×2 mm in the surface central portions of the lower electrode made of ITO were masked by an insulating film was fabricated. Next, a metal mask having an aperture over the exposed sections of the lower electrode becoming each light emitting region was arranged over the substrate in proximity thereto, and a function layer similar to of the examples was formed. After that, as a cathode becoming a mirror, an upper electrode was formed by depositing a thin film being 200 nm thick at a co-deposition ratio of Mg:Ag=10:1. Thereby, the display unit of Comparative example 1 was obtained.

COMPARATIVE EXAMPLE 2

A display unit was fabricated as in Example 1, except that the film thickness of the cathode was 20 nm. The reflectance of the cathode in this case was 60% with respect to light with wavelength of 550 nm.

For the display units of the examples and the comparative examples fabricated as above, the spectrums of light extracted from each organic EL device were measured.

Figure 22:
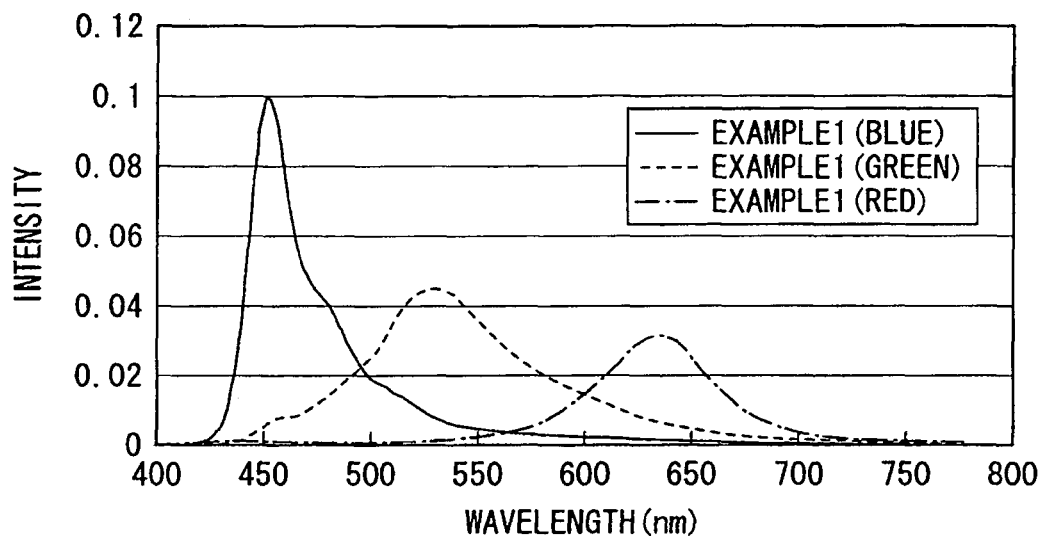
FIG. 22 shows spectrums of respective organic EL devices in a display unit of Example 1.

FIG. 22 shows spectrums of light extracted from each organic EL device 3B, 3G, and 3R of the display unit of Example 1. From the figure, it was confirmed that light emitting intensity of the spectrum was significantly different among the blue, green, and red wavelength regions, and light in the wavelength regions desired to be extracted from each organic EL device 3B, 3G, and 3R was selectively extracted by multiple interference effects.

Figure 23:
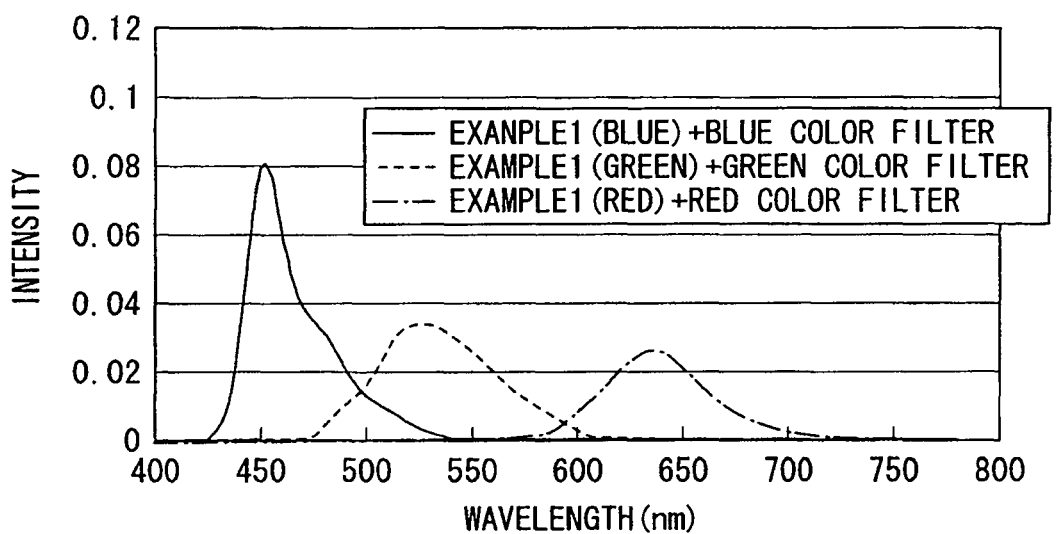
FIG. 23 shows spectrums of the respective organic EL devices when color filters are provided for the display unit of Example 1.
Figure 24:
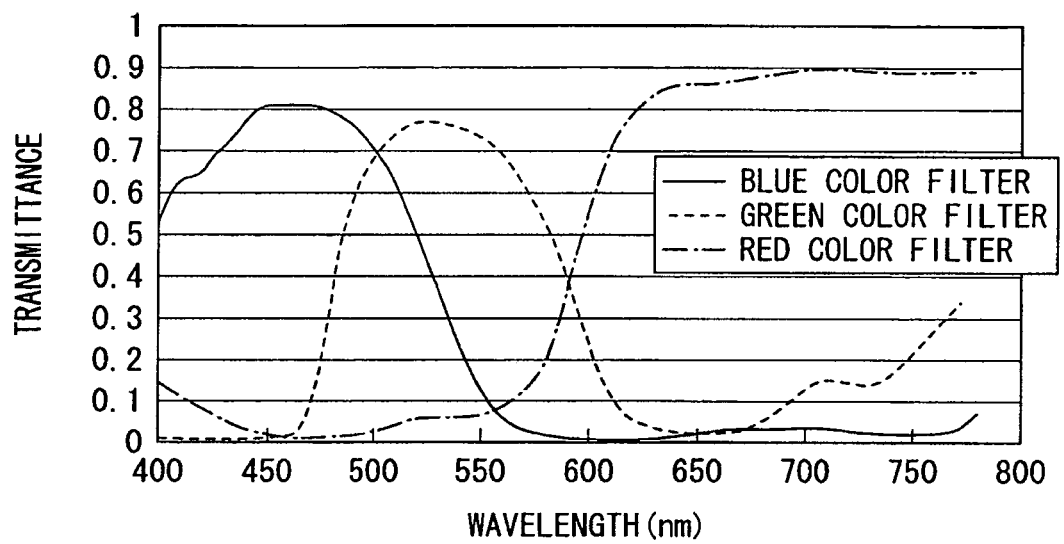
FIG. 24 is a view showing transmittance characteristics of the color filters used for a simulation of FIG. 23.

Further, FIG. 23 shows simulation results in the case that color filters of each color which transmit only the wavelength of each color were provided correspondingly to each organic EL device 3B, 3G, and 3R on the light emitting face side in the display unit of Example 1. FIG. 24 shows transmittance characteristics of the color filters of each color applied to the display unit of Example 1. As shown in FIG. 23, it was confirmed that by providing the color filters in combination, in the display unit of Example 1, unnecessary wavelength region component in the spectrums was decreased, and color purity of blue, green, and red light extracted from each organic EL device 3B, 3G, and 3R was improved.

Figure 25:
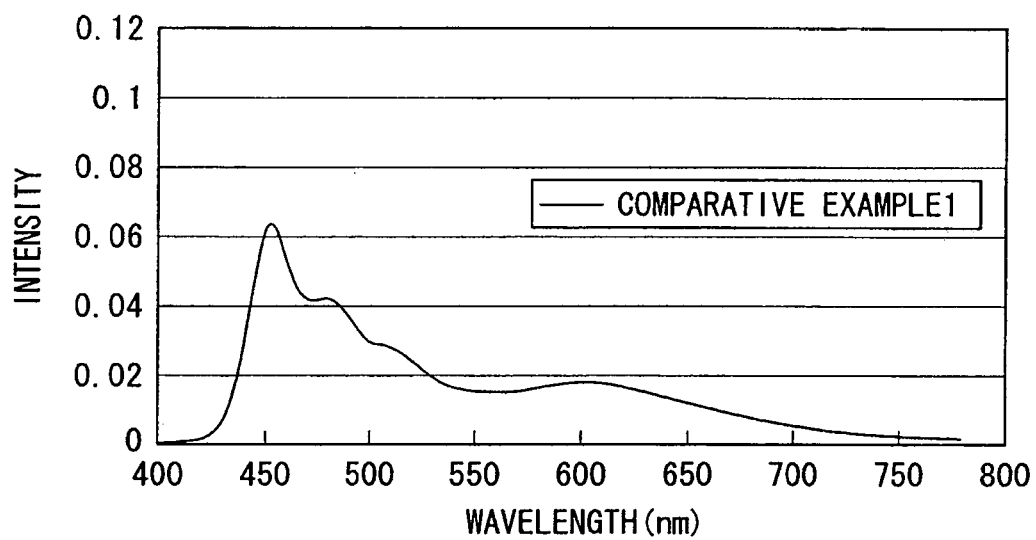
FIG. 25 shows a spectrum of an organic EL device in a display unit of Comparative example 1.

Meanwhile, FIG. 25 shows a spectrum of light extracted from each organic EL device in the display unit of Comparative example 1. From the figure, it was confirmed that each organic EL device provided on the display unit of Comparative example 1 emitted white light having light emitting regions in all wavelength regions of blue, green, and red.

Figure 26:
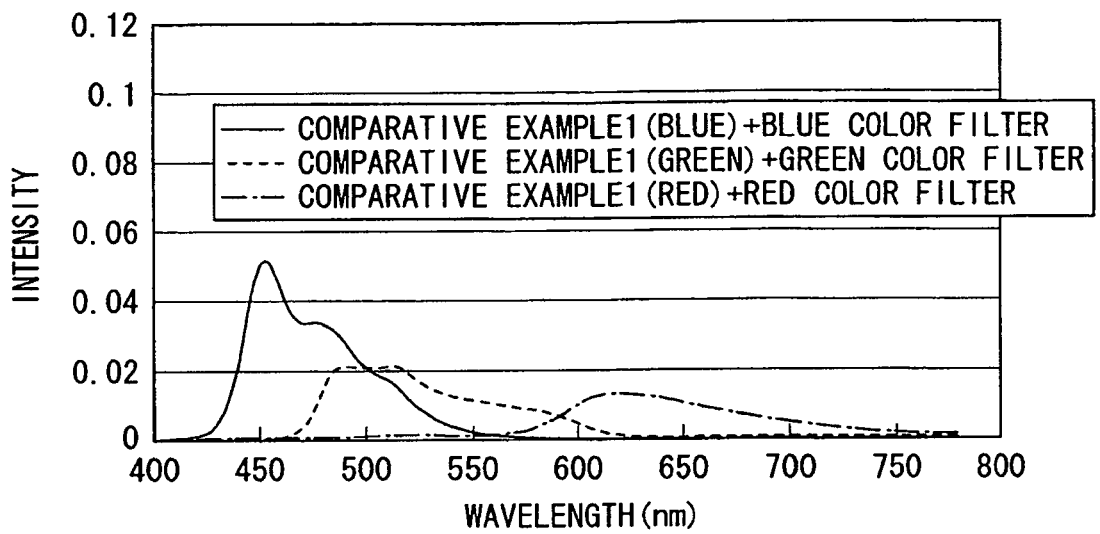
FIG. 26 shows spectrums of the respective organic EL devices when color filters are provided for the display unit of Comparative Example 1.

FIG. 26 shows simulation results in the case that each color filter which transmits only the wavelength of each color of blue, green, and red was provided correspondingly to each organic EL device on the light emitting face side in the display unit of Comparative example 1. Each color filter shall show transmittance characteristics as in FIG. 24. As shown in FIG. 26, by providing the color filters for the display unit of Comparative example 1, color could be adjusted to blue, green, and red. However, compared to the case that the color filters were provided for the display unit of Example 1 as shown in FIG. 23, the intensity of the spectrums was small and the color purity was poor.

Figure 27:
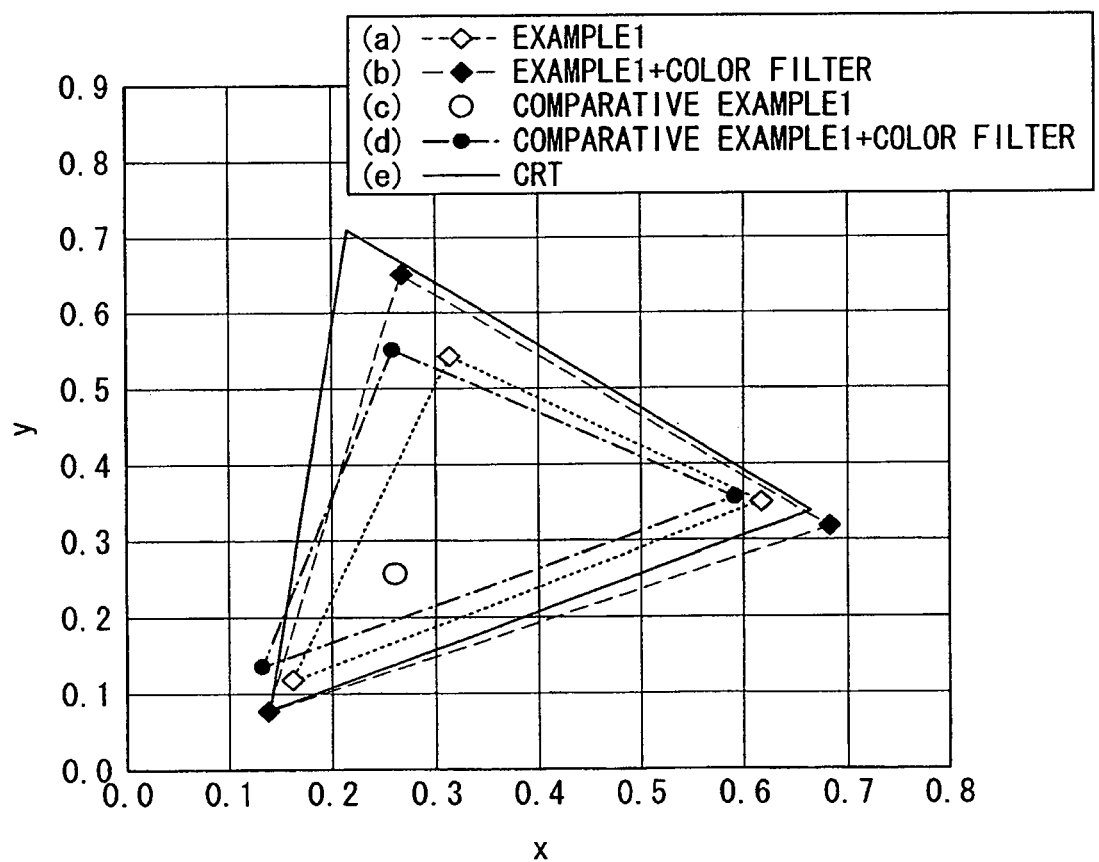
FIG. 27 is a chromaticity diagram showing chromaticity values of each display unit and a CRT display.

Further, FIG. 27 shows each chromaticity value of (a) display unit of Example 1, (b) display unit of Example 1 provided with the color filters of FIG. 24, (c) display unit of Comparative example 1, and (d) display unit of Comparative example 1 provided with the color filters of FIG. 24, together with chromaticity values of (e) NTSC (National Television System Committee).

From the chromaticity diagram, it was confirmed as (a) and (b) as follows. That is, (a) even in the display unit of Example 1 not provided with the color filters, favorable color chromaticity was shown; and (b) by providing the color filters for the display unit of Example 1, display with color chromaticity equal to NTSC was enabled.

Figure 28:
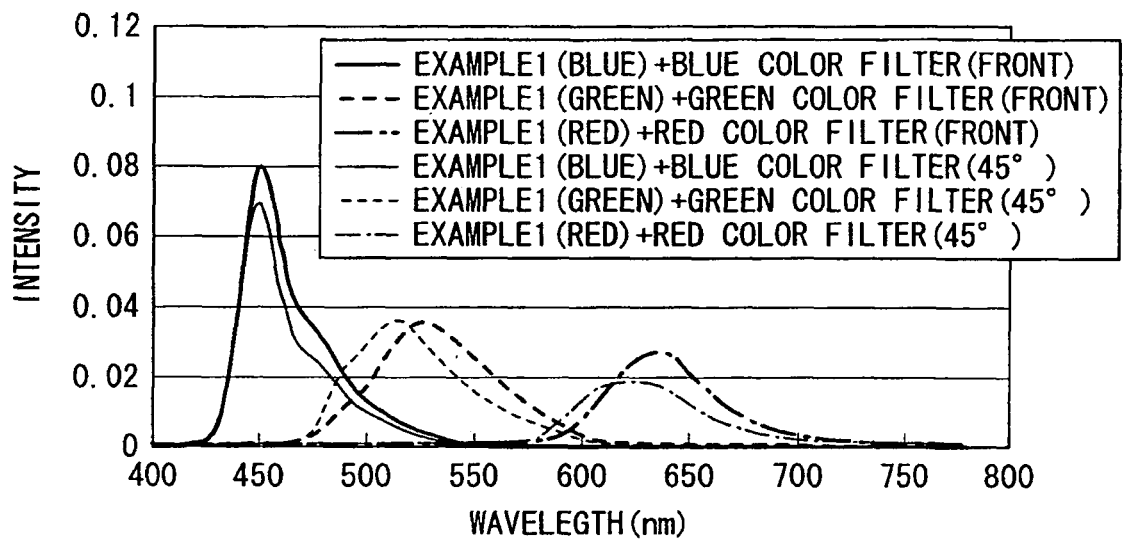
FIG. 28 shows view angle dependence of spectrums of the respective organic EL devices when the color filters are provided for the display unit of Example 1.
Figure 29:
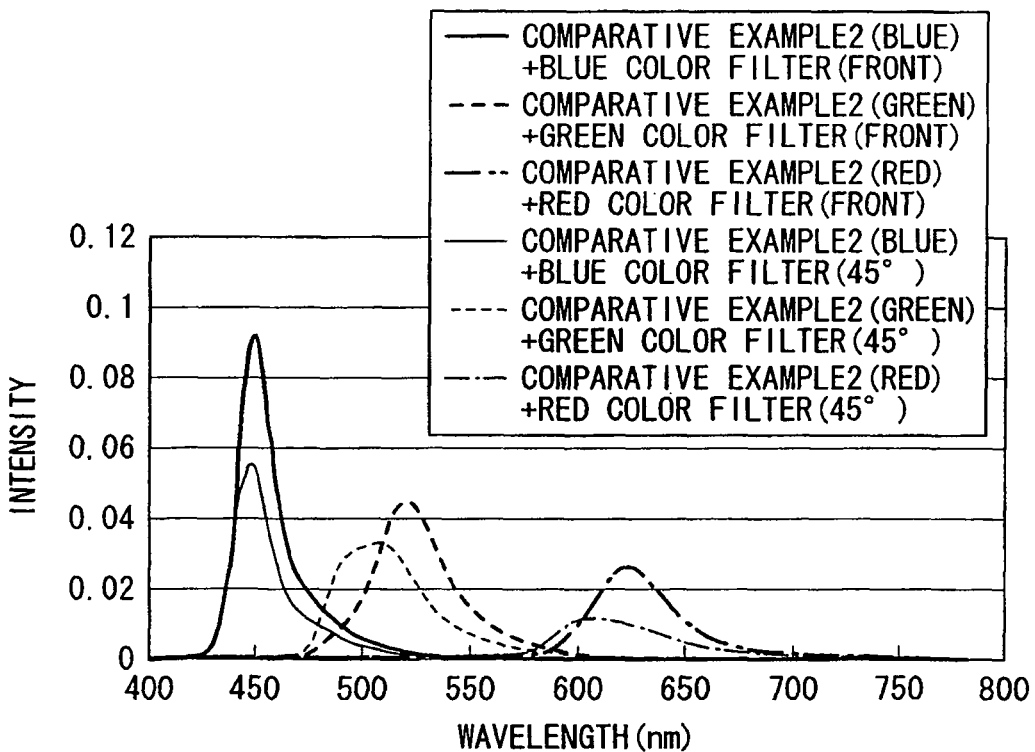
FIG. 29 shows view angle dependence of spectrums of the respective organic EL devices when the color filters are provided for the display unit of Comparative example 1.

FIG. 28 shows simulation results in the case that color filters were provided for the measured results of view angle dependence (front and 45 deg) of the display unit of Example 1. FIG. 29 shows simulation results in the case that color filters were provided for the measured results of view angle dependence (front and 45 deg) of the display unit of Comparative example 2. From these figures, it was confirmed as follows. That is, when the reflectance of the cathode as a half mirror was high, the view angle dependence of extracted light was large, that is, change of luminance and chromaticity was large. Meanwhile, when the reflectance of the cathode as a half mirror was low, the view angle dependence of extracted light was small, that is, change of luminance and chromaticity was small. Though detailed data is not shown, based on the results shown in FIG. 28 and FIG. 29, the view angle dependence was examined by simulation while changing the reflectance of the cathode. In the result, it was confirmed that in order to appropriately reduce view angle dependence of extracted light, the reflectance of the cathode shall be in the range from 0.1% to less than 50%.

Finally, Table 1 shows view angle dependence (front and 45 deg) of luminance and chromaticity in the case that color filters were provided for the display units of Examples 1 to 5 and the display unit of Comparative example 2, respectively. The luminance change ratio shown in Table 1 is a ratio between the luminance at 45 deg and the luminance at the front (=luminance at 45 deg/luminance at the front).

From Table 1, it was confirmed that in the display units of Examples 1 to 5, the luminance change ratio was larger than of the display unit of Comparative example 2, and therefore, the view angle dependence was small compared to of the display unit of Comparative example 2. Though detailed data is not shown, based on the results shown in Table 1, view angle dependence of luminance and chromaticity was similarly examined while setting the optical distances Lt and Lf in the foregoing formula (2) so that the value of m (m (blue), m (green), and m (red)) in the foregoing formula (1) was changed, not only in the display units under the conditions of m (blue), m (green), and m (red)=0,0,0; 1,0,0; 1,1,0; 1,1,1; and 2,1,1 corresponding to Examples 1 to 5, but also in the display units under the conditions of m (blue), m (green), and m (red)=2,2,1; and 2,2,2, the view angle dependence was small compared to of the display unit of Comparative example 2. From the foregoing series of results, it was confirmed that in the display unit of the present invention, favorable color reproducibility could be shown and the view angle dependence of display color was small.

and a light emitting layer disposed between the first electrode and the second electrode, each of the first, second, and third organic light emitting devices is configured to emit a light reflected by the first electrode and transmitted through the second electrode, in the first light emitting device, the second electrode is arranged at a first distance from the first electrode, in the second light emitting device, the second electrode is arranged at a second distance from the first electrode, in the third light emitting device, the second electrode is arranged at a third distance from the first electrode, the first distance is larger than the second distance, the second distance is larger than the third distance, and the light emitting layers in the first light emitting device, the second light emitting device, and the third light emitting device are made of an identical light emitting layer extending throughout the plurality of organic light emitting devices.

2. The display unit according to claim 1, wherein light generated in respective first, second, and third light emitting layers is extracted through the respective second electrode.

3. The display unit according to claim 1, wherein a thickness of the second electrode ranges from about 1 nm to about 50 nm.

4. The display unit according to claim 1, wherein the display unit is a bottom emission type display.

5. The display unit according to claim 1,
wherein the first light emitting device is configured to emit red light,

TABLE 1

| | | Front | | | 45 deg | | | Luminance transition ratio |
|---|---|---|---|---|---|---|---|---|
| | | Luminance | Chromaticity | | Luminance | Chromaticity | | |
| | | cd/m² | x | y | cd/m² | x | y | |
| Example 1 | blue | 260 | 0.139 | 0.076 | 194 | 0.142 | 0.067 | 0.83 |
| | green | 1240 | 0.267 | 0.649 | 1000 | 0.210 | 0.636 | |
| | red | 270 | 0.677 | 0.321 | 275 | 0.664 | 0.336 | |
| Example 2 | blue | 342 | 0.133 | 0.078 | 175 | 0.140 | 0.060 | 0.77 |
| | green | 1381 | 0.237 | 0.676 | 1032 | 0.151 | 0.628 | |
| | red | 473 | 0.679 | 0.318 | 475 | 0.657 | 0.341 | |
| Example 3 | blue | 323 | 0.134 | 0..75 | 174 | 0.144 | 0.048 | 0.78 |
| | green | 857 | 0.295 | 0.659 | 665 | 0.157 | 0.683 | |
| | red | 452 | 0.675 | 0.325 | 435 | 0.665 | 0.335 | |
| Example 4 | blue | 328 | 0.133 | 0.079 | 185 | 0.143 | 0.050 | 0.77 |
| | green | 924 | 0.265 | 0.652 | 655 | 0.163 | 0.639 | |
| | red | 288 | 0.683 | 0.314 | 345 | 0.660 | 0.339 | |
| Example 5 | blue | 244 | 0.130 | 0.078 | 122 | 0.150 | 0.037 | 0.77 |
| | green | 919 | 0.279 | 0.647 | 678 | 0.174 | 0.648 | |
| | red | 337 | 0.790 | 0.318 | 349 | 0.658 | 0.341 | |
| Comparative example 2 | blue | 146 | 0.146 | 0.047 | 92 | 0.148 | 0.046 | 0.66 |
| | green | 1000 | 0.197 | 0.694 | 644 | 0.147 | 0.611 | |
| | red | 266 | 0.677 | 0.323 | 193 | 0.648 | 0.352 | |

The invention is claimed as follows:

1. A display unit comprising:
a plurality of transistors;
a plurality of organic light emitting devices arranged on the plurality of transistors, and the plurality of organic light emitting devices including a first light emitting device, a second light emitting device, and a third light emitting device; and
a color filter arranged on the plurality of organic light emitting devices,
wherein,
each of the first, second, and third organic light emitting devices comprises a first electrode, a second electrode, wherein the second light emitting device is configured to emit green light, and wherein the third light emitting device is configured to emit blue light.

6. The display unit according to claim 1, further comprising an insulating film separating the first, second, and third light emitting devices.

7. The display unit according to claim 1, wherein the first electrode is a mirror layer, and wherein the second electrode is a half mirror layer.

8. The display unit according to claim 7, wherein the organic light emitting devices have a resonator structure for resonating light emitted in the light emitting layers by using a space between the mirror and the half mirror as a resonant section.

9. The display unit according to claim 1, further comprising a hollow sealing cap.

10. The display unit according to claim 1, further comprising a protective layer arranged on the organic light emitting devices, an adhesive layer arranged on the protective layer, and a sealing panel arranged on the adhesive layer.

11. The display unit according to claim 1, further comprising a planarizing layer disposed between the plurality of organic light emitting devices and the plurality of thin film transistors.

12. The display unit according to claim 11, further comprising a wiring connected to the plurality of organic light emitting devices and arranged on the planarizing layer.

13. A display unit comprising:
a plurality of transistors;
a plurality of organic light emitting elements arranged on the plurality of transistors; and
a color filter arranged on the plurality of organic light emitting elements,
wherein the organic light emitting elements includes a first organic light emitting element, a second organic light emitting element, and a third organic light emitting element,
wherein each of the first, second, and third organic light emitting elements comprises a first electrode, a second electrode, and a light emitting layer disposed between the first electrode and the second electrode,
wherein each of the first, second, and third organic light emitting elements is configured to emit a light reflected by the first electrode and transmitted through the second electrode,
wherein the transistors include a first transistor configured to control the first organic light emitting element, a second transistor configured to control the second organic light emitting element, and a third transistor configured to control the third organic light emitting element,
wherein, in the first light emitting element, the first electrode has a reflective surface, the second electrode is arranged at a first distance from the first electrode, and generated light is extracted through the second electrode,
wherein, in the second light emitting element, the first electrode has the reflective surface, the second electrode is arranged at a second distance from the first electrode, and generated light is extracted through the second electrode,
wherein, in the third light emitting element, the first electrode has the reflective surface, the second electrode is arranged at a third distance from the first electrode, and generated light is extracted through the second electrode,
wherein the first distance is larger than the second distance,
wherein the second distance is larger than the third distance, and
wherein the light emitting layers in the first, second, and third light emitting elements are made of an identical light emitting layer extending throughout the plurality of organic light emitting elements.

14. The display unit according to claim 13, wherein a thickness of the second electrode ranges from about 1 nm to about 50 nm.

15. The display unit according to claim 13, wherein the first electrode is a mirror layer, and wherein the second electrode is a half mirror layer.

16. The display unit according to claim 15, wherein the organic light emitting elements have a resonator structure for resonating light emitted in the light emitting layers by using a space between the mirror and the half mirror as a resonant section.

17. The display unit according to claim 13, further comprising a hollow sealing cap.

18. The display unit according to claim 13, further comprising a planarizing layer disposed between the plurality of organic light emitting elements and the plurality of transistors.

19. The display unit according to claim 13, wherein the display unit is a bottom emission type display.

* * * * *